(12) United States Patent
Ohkawa

(10) Patent No.: US 7,372,491 B2
(45) Date of Patent: May 13, 2008

(54) CMOS IMAGE SENSOR

(75) Inventor: Narumi Ohkawa, Kuwana (JP)

(73) Assignee: Fujitsu Limited, Kawasaki (JP)

( * ) Notice: Subject to any disclaimer, the term of this patent is extended or adjusted under 35 U.S.C. 154(b) by 671 days.

(21) Appl. No.: 10/832,313

(22) Filed: Apr. 27, 2004

(65) Prior Publication Data

US 2004/0252212 A1    Dec. 16, 2004

(30) Foreign Application Priority Data

Jun. 13, 2003    (JP)    ............... 2003-169113

(51) Int. Cl.
*H04N 5/335*    (2006.01)
(52) U.S. Cl. .................................... 348/308
(58) Field of Classification Search ................ 348/308, 348/294, 300, 348; 250/208.1, 214.1; 345/90, 345/100
See application file for complete search history.

(56) References Cited

U.S. PATENT DOCUMENTS

| | | | | |
|---|---|---|---|---|
| 6,115,066 | A * | 9/2000 | Gowda et al. | 348/308 |
| 6,344,877 | B1 * | 2/2002 | Gowda et al. | 348/245 |
| 6,346,696 | B1 * | 2/2002 | Kwon | 250/208.1 |
| 6,657,665 | B1 * | 12/2003 | Guidash | 348/308 |
| 6,731,335 | B1 * | 5/2004 | Kim et al. | 348/308 |
| 6,765,186 | B2 * | 7/2004 | Janesick | 250/208.1 |
| 6,768,482 | B2 * | 7/2004 | Asano et al. | 345/90 |
| 6,780,666 | B1 * | 8/2004 | McClure | 438/57 |
| 6,882,364 | B1 * | 4/2005 | Inuiya et al. | 348/252 |
| 6,930,299 | B2 * | 8/2005 | Ohkawa | 250/208.1 |
| 6,933,976 | B1 * | 8/2005 | Suzuki | 348/315 |
| 6,960,796 | B2 * | 11/2005 | Rhodes et al. | 257/222 |

FOREIGN PATENT DOCUMENTS

| | | |
|---|---|---|
| JP | A2001-298177 | 10/2001 |
| JP | A2002-101341 | 4/2002 |
| JP | 2002-142149 | 5/2002 |

* cited by examiner

*Primary Examiner*—Lin Ye
*Assistant Examiner*—Amy Hsu
(74) *Attorney, Agent, or Firm*—Westerman, Hattori, Daniels & Adrian, LLP.

(57) ABSTRACT

Provided is a photographing apparatus (CMOS image sensor) that enables enlarging the area that the PD occupies by making simple the layout within a pixel wherein a photo-electric conversion element and a plurality of CMOS transistors are laid out. The photographing apparatus is the one 1 wherein a photo-diode 11 constituting the photo-electric conversion element and a plurality of transistors 12, 13, 14, and 15 are laid out in parallel in the column arrangement direction of the pixels 10 that are arrayed in the form of a lattice. In the apparatus, further, the pixels 10 are each arrayed in the way of being shifted half the length of the pixel 10 in the column arrangement direction every row. Within the pixel 10, by arraying the photo-diode 11 and the plurality of transistors 12, 13, 14, and 15 in parallel in the way that either arrangement thereof is positioned in one vertical column, it is possible to increase the occupied-area percentage of the photo-diode 11 as well as the width of the gate electrode of the transistor.

13 Claims, 27 Drawing Sheets

(a) suare array (Bayer type)

(b) shifted-by-1/2-pitch array

CMOS IMAGE SENSOR

CROSS-REFERENCE TO RELATED APPLICATIONS

This application claims priority to Japanese Patent Application No.JPA2003-169113 entitled "PHOTOGRAPHING APPARATUS" filed Jun. 13, 2003, which is entirely and specifically incorporated by reference.

BACKGROUND OF THE INVENTION

1. Field of the Invention

The present invention relates to a solid state photographing apparatus which is used to recognize an image as in the case of, for example, a digital camera and in which there are arrayed on a semiconductor substrate a plurality of cells each constructed using a combination of a photo-electric conversion element and transistors.

2. Prior Art

When roughly classified, small-sized photographing apparatuses are so done mainly into a type that each uses a CCD and a type that each uses a CMOS image sensor. Attention has nowadays been drawn toward a CMOS photographing apparatus (hereinafter referred to as "the CMOS image sensor") that enables manufacturing a transistor part for driving a photo-electric conversion element, the use of that is needed for the photographing apparatus, by performing almost the same process steps as those for manufacturing an ordinary CMOS transistor. Further, compared with the CCD type, that CMOS photographing apparatus has the merit of its relevant portions' being able to be converted into a one-chip arrangement by being integrated on the same substrate when they are in the manufacturing process steps. The apparatus therefore has the merit of the drive's thereof being relatively small in power consumption. The apparatus further has the merit of being made small in size and low in cost.

However, compared with the CCD type, the CMOS type had the demerit of its being low in sensitivity. An example of a circuit structure of that CMOS image sensor is shown next. FIG. 30 is a plan view showing a conventional layout of the array wherein CMOS transistors are arrayed. As shown in FIG. 30, an active region is provided on a semiconductor substrate by means of element-isolating films thereon. The active region has at the center of the pixel a rectangular region as the photo-diode region and, further, has a substantially horizontally thrown U-shaped region connected thereto. The gate electrode of each CMOS transistor is formed in the way of crossing the active region of FD like the shape of the substantially horizontally thrown letter U. For enabling making great the saturated amount of electric charge of the photo-electric conversion element such as the photo-diode in that CMOS transistor arrangement, the occupied area of the photo-diode within the pixel is enlarged. By doing so, it is possible to enhance the sensitivity. However, in the above-mentioned circuit structure, the percentage of the area occupied by the photo-diode within the pixel is 29%, and, therefore, if the layout of the array of the CMOS transistors remains unchanged, it is difficult to make again higher the percentage of the area occupied by the photo-diode.

Also, by making large the size of the CMOS transistors within the pixel, especially the width of the gate electrodes thereof, it is possible to lessen the variation in characteristic of the CMOS transistors and, in consequence, to enhance the sensitivity of the CMOS image sensor. However, if the above-mentioned layout of the array of the CMOS transistors remains unchanged, it is difficult to make large the width of the gate electrodes.

SUMMARY OF THE INVENTION

Accordingly, in order to improve the above-mentioned inconveniences, there have hitherto been disclosed various kinds of CMOS transistors. For instance, JPA-2001-298177 or JPA2002-101341 discloses a solid state photographing apparatus wherein there are arrayed on the same semiconductor substrate a plurality of unit cells each of that has a plurality of light-receiving regions and a common circuit part that outputs signals from the plurality of light-receiving regions or the processed signals obtained by processing those signals. In that apparatus, the common circuit part is divided into at least two circuit construction parts; and one or more circuit construction parts are disposed between the adjacent light-receiving regions within the unit cell; and the remaining circuit construction parts are disposed between the light-receiving region within the unit cell and a light-receiving region within an adjacent unit cell thereto. However, this cited invention is the invention that aims to prevent mutual mixing of the output signals. In addition, because the light-receiving region is divided, it is difficult to make up into a layout wherein the read-out region is simple. And, it is difficult to enhance the sensitivity of the CMOS image sensor. Also, JPA2002-142149 discloses an image processor in the CCD type and, in this literature, a description is given to the effect of making the CCD photographing element a honeycomb type. However, no description is given to the effect that altering the layout within the pixel can enhance the sensitivity.

The present invention has been made under the above-mentioned existing circumstances and an object thereof is to provide a photographing apparatus having a layout that, by giving a technical idea to the array of a photo-electric conversion element and a plurality of transistors within a relevant pixel, enables making great the occupied-area of the photo-electric conversion element as well as the width of the electrode.

For solving the above-mentioned problems, the present invention provides a photographing apparatus, the photographing apparatus including pixels each of that is constructed of a photo-electric conversion element and a first transistor that transfers a signal of the photo-electric conversion element, a second transistor that amplifies the signal, a third transistor that resets the second transistor, and a fourth transistor that reads out a signal from the second transistor, wherein, in that pixel, the photo-electric conversion element and the first, second, third, and fourth transistors are laid out in parallel in the column direction of the pixels arrayed in the form of a lattice.

As a result of this, within the pixel, the transistors having at least the above-mentioned functions are arrayed vertically in a row in the row direction and are arrayed in parallel with the photo-electric conversion element in the column direction. By this, it is possible to make high the occupied area percentage of the photo-electric conversion element and make high the sensitivity of the photographing element.

Also, the present invention provides a photographing apparatus, the photographing apparatus including pixels each of that is constructed of a photo-electric conversion element and a first transistor that amplifies a signal from the photo-electric conversion element, a second transistor that resets the first transistor, and a third transistor that reads out a signal from the first transistor, wherein, in that pixel, the photo-electric conversion element and the first, second, third, and fourth transistors are laid out in parallel in the row direction of the pixels arrayed in the form of a lattice.

As a result of this, in the photographing apparatus that is constructed of three transistors, within the pixel, the transistors are arrayed vertically in a row in the row direction and are arrayed in parallel with the photo-electric conversion element in the column direction. By this, it is possible to make high the occupied area percentage of the photo-electric conversion element and make high the sensitivity of the photographing element.

Also, the present invention provides a photographing apparatus wherein the pixel is disposed in the way that the pixel is shifted half the width of the pixel in the column direction every row. As a result of this, the transistors are arrayed on a straightforward line in parallel in the column direction, so that it is not needed to curve the active region into the shape of a horizontally thrown letter U. Also, it is possible to make narrow the interval or spacing between each two of the transistors and make high the occupied area percentage of the photo-electric conversion element.

Also, the present invention provides a photographing apparatus wherein the left/right arrayed positions of the photo-electric conversion element and these transistors in the pixel are inverted every row. Also, the present invention provides a photographing apparatus wherein, in the pixel, the left/right sides of patterns of metal wiring layers in adjacent rows are inverted. As a result of this, the wiring can be made common, and it becomes possible to make large the gate electrode, etc. of the transistor, and it is possible to make less the variation in sensitivity of the photographing element.

Also, the present invention provides a photographing apparatus wherein, in the pixel, patterns of metal wiring layers in adjacent rows are different from each other. As a result of this, the pattern of the metal wiring layer becomes the same every other row, and, regarding the rows that are adjacent, the pattern thereof is changed and part of the metal wiring is made common. Furthermore, the leading line can be made short and also the layout of the wiring can be mitigated.

Also, the present invention provides a photographing apparatus wherein, in the pixel, gate electrodes of the first transistor and fourth transistor are connected to each other by the same metal wiring. As a result of this, it is possible to make large the thickness of the gate electrode and make less the variation in sensitivity of the photographing element.

DETAILED DESCRIPTION OF THE PREFERRED EMBODIMENTS

Hereinafter, preferred embodiments of the present invention will be explained with reference to the drawings.

Embodiment 1

Figure 1:
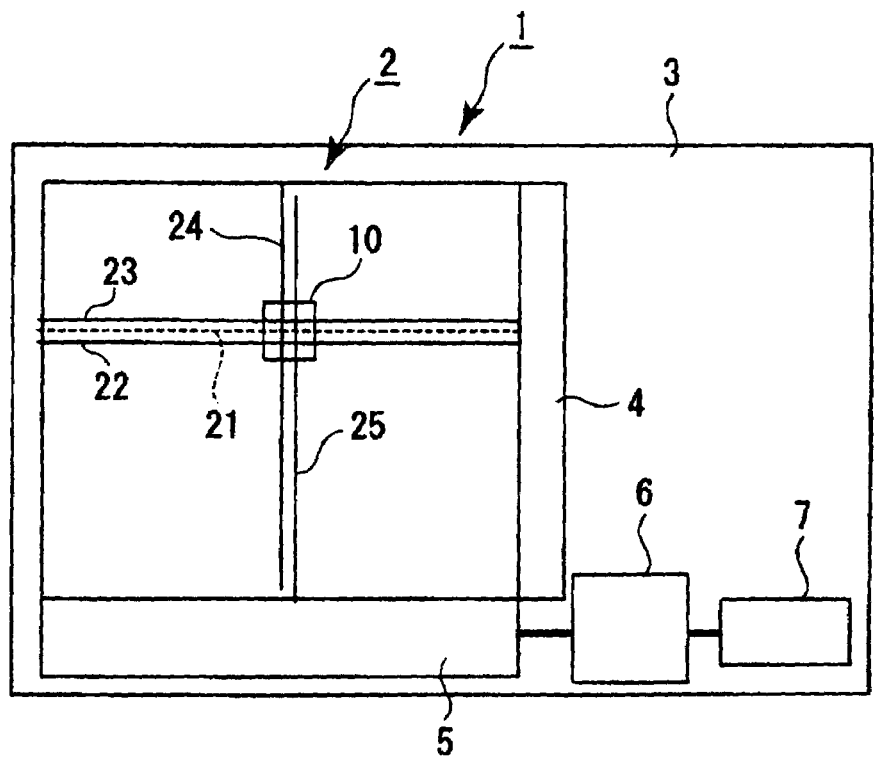
FIG. 1 is a circuit diagram showing a single piece of pixel in a CMOS image sensor according to an embodiment of the present invention.
Figure 2:
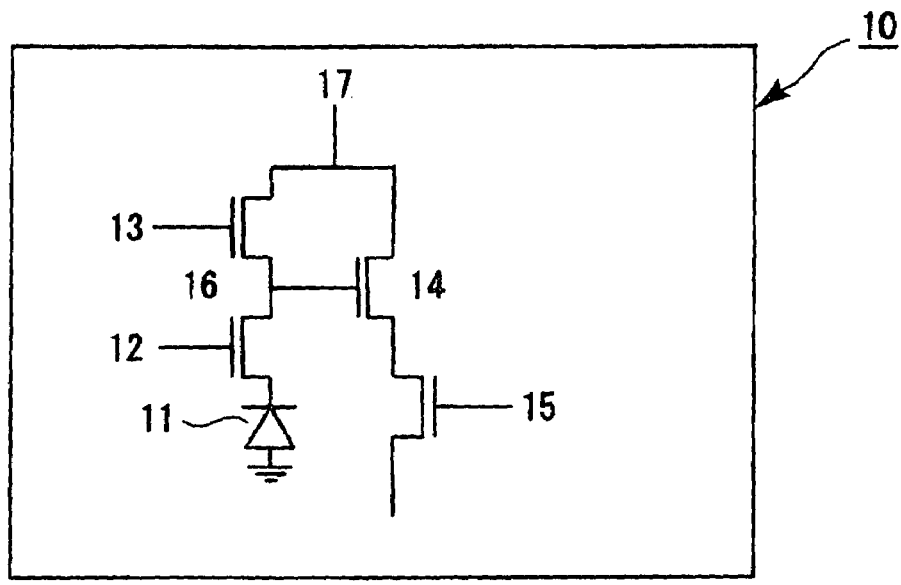
FIG. 2 is a circuit diagram showing the CMOS image sensor according to the embodiment of the present invention.

FIG. 1 is a circuit diagram showing a single piece of pixel in a photographing apparatus according to an embodiment of the present invention. FIG. 2 is a circuit diagram showing the photographing apparatus that embodies the present invention.

As shown in FIG. 1, this photographing apparatus 1 (hereinafter referred to as "the image sensor") has on a silicon substrate 3 that is a semiconductor substrate a photographing element 2 (only one piece is shown here) having arrayed thereon a plurality of pixels 10, a row selection circuit 4 that controls a read-out row with respect to the photographing element, a read-out/noise cancel circuit 5 that reads out the signal of the pixel 10, an amplifier/AD converter 6 that is connected to that signal read-out/noise cancel circuit 5, and an output circuit 7.

As shown in FIG. 1, a reset line 21, a select line 22, and a transfer line 23 are each extended in the row direction and connected to the row selection circuit 4. Also, a signal read-out line 25 is connected to the signal read-out/noise cancel circuit. The signal read-out/noise cancel circuit 5 is connected to the output circuit 7 via the amplifier/AD converter 6. The reset voltage line 24 is connected to a reset power source that supplies a desired power source voltage.

Here, as shown in FIG. 1 or FIG. 2, the photographing apparatus is a CMOS image sensor that is equipped with a pixel 10 (hereinafter referred to simply as "the 4TR type") that is constructed of a photo-diode (hereinafter referred to as "PD") 11 that is one piece of photo-electric conversion element and four CMOS transistors: a transfer transistor (hereinafter referred to as "TG") 12 that is the first transistor, a reset transistor (hereinafter referred to as "RST") 13 that is the second transistor, a source follower transistor (hereinafter referred to as "SF-Tr") 14 that is the third transistor, and a select transistor (hereinafter referred to as "SE") that is the fourth transistor.

A cathode terminal of the PD 11 is connected to a source terminal of the TG 12 and an anode terminal thereof is grounded. A drain terminal of the TG 12 is connected to a source terminal of the RST 13 and to a gate terminal of the SF-Tr 14. A source terminal of the SF-Tr 14 is connected to a drain terminal of the SE 15. Also, gate terminals of the RST's 13 of the pixels 10 that are adjacent to each other in the row direction are connected to each other by a reset line (hereinafter referred to as "the RST line") 21. This RST line 21 is extended in the row direction and is connected to the row selection circuit 4. Also, a transfer gate line (hereinafter referred to as "the TG line") 23 that connects the TG's 12 of the pixels 10 in the row direction and a select line (hereinafter referred to as "the SE line") 22 that connects gate terminals of the SE's 15 of adjacent pixels 10 in the column direction are extended in the row direction and connected to the row selection circuit 4. Also, a signal read-out line 25 that commonly connects source terminals of the SE's 15 of the pixels 10 that are adjacent in the column direction and the RST line 21 that commonly connects drain terminals of the RST's 13 and drain terminals of the SF-Tr's 14 are connected to the photographing element 2.

The CMOS image sensor operates as follows. It is now assumed that every CMOS transistor be of an N type; and each CMOS transistor gets turned on when its gate potential is high in level while the CMOS transistor gets turned off when its gate potential is low in level. As shown in FIG. 1, first, a signal is applied to every one of the whole RST row lines 21, every one of the whole TG row lines 23, and every one of the whole SE row lines 22 to collectively reset the PD's 11 on the whole row lines as well as floating diffusion parts (hereinafter referred to simply as "the FD") 16 each of that accumulates therein electric charge that has come up in the PD 11. As a result of this, each of the PD's 11 and FD's 16 is reset to a state of its voltage being increased up to a prescribed value. Subsequently, when the TG line 23 is turned off, reception of light by the PD 11 is started, electric charge comes up in the PD 11, and the voltage of the PD 11 is gradually decreased.

Subsequently, a reset signal is collectively applied to the whole RST lines 21. As a result of this, only the FD's 16 alone are collectively reset, with the result that the voltage of each FD 16 gets stabilized to a prescribed value that reflects the reset voltage VR 17.

Subsequently, each of the whole TG lines 23 is turned on, whereby the electric charge within the PD 11 is transferred to the FD 16. As a result of this, the voltage of the FD 16 is decreased by the level corresponding to the transferred amount of electric charge. At this time, preferably, the SE 15 also is turned on together with the TG 12 to leave the signal read-out line 25 kept in a state of high impedance that is kept electrically disconnected from the surrounding read-out circuit part.

Subsequently, the read-out operation will be sequentially done. In order to perform read-out operation, a select signal is applied to the SE lines 22. By this, a voltage that is obtained by subtracting the changed amount $\Delta V$ of voltage that corresponds to the amount of charge that has theretofore been accumulated in each PD 11 is output onto the signal read-out line 25.

Subsequently, when a reset signal is applied to the RST lines 21, the FD 16 is reset and its voltage gets stabilized to the prescribed value that reflects the VR 17. This voltage is applied to the gate terminal of the SF-Tr 14. When, in that state, a select signal is applied to the SE lines 22, a voltage is output onto the signal read-out line 25. Subsequently, through the operation of the signal read-out/noise cancel circuit 5, the difference between the VR read-out voltage and the signal read-out voltage is determined to obtain the changed amount $\Delta V$ of voltage. In this way, the variation in output voltage that follows the variation in threshold voltage of the SF-Tr 14 in each pixel 10 is canceled, whereby the changed amount of voltage that corresponds to the amount of electric charge that is until that time accumulated in the PD 11 through its reaction made with respect to the amount of light can be accurately read out.

FIGS. 3(a) and 3(b) are typical views each showing the array of the pixels in the CMOS image sensor according to the embodiment of the present invention, FIG. 3(a) being a schematic view showing the construction of a square array (Bayer) type wherein the pixels are arrayed in the form of a lattice and FIG. 3(b) being a schematic view showing the construction of a shifted-by-½-pitch pixel array type wherein the pixels are each arrayed by being shifted, in the row direction, relative to those that are adjacent thereto in the column direction by half of the width thereof every row. Through that array of the pixels 10, operating each pixel 10 enables obtaining monochromatic color information with a filter provided on the uppermost surface of the CMOS image sensor 1. At this time, in order to obtain primary colors of red, green, and blue that are three primary colors of a thing, there is used a complementary chromatic filter for each of the three primary colors. As shown in FIG. 3(a), in a row (the upper-side row in FIG. 3(a)) in the CMOS image sensor 1, a green pixel 10G for obtaining a green color and a red pixel 10R for obtaining a red color are alternately arrayed. In a row that is immediately below that row, while that every consecutive one of the green pixels 10G gets arrayed in the row direction is being avoided, a blue pixel 10B for obtaining a blue color and the green pixel 10G are alternately arrayed. Also, as shown in FIG. 3(b), in a row (the upper-side row in FIG. 3(b)), the blue pixel 10B and the red pixel 10R are alternately arrayed. In a row that is immediately below that row, the green pixels 10G only are arrayed. In FIG. 3(b), the pixels may be arrayed in the way that, in one row, the green pixel 10G and the red pixel 10R are alternately arrayed and, in the other row, the blue pixels 10B and the green pixels 10G are alternately arrayed.

Figure 4:
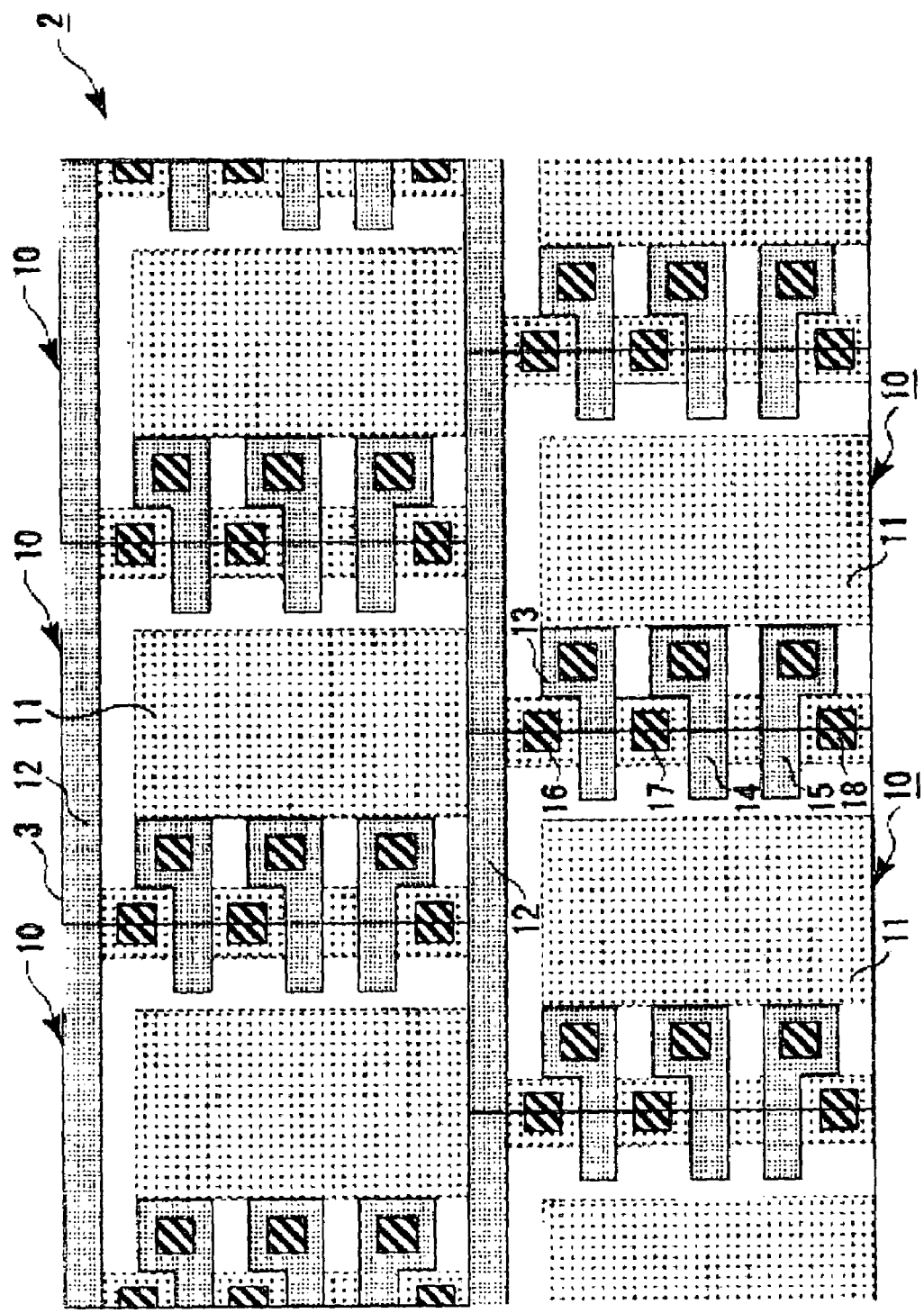
FIG. 4 is a plan view showing a layout of the active region and CMOS transistor array in the pixel.
Figure 5:
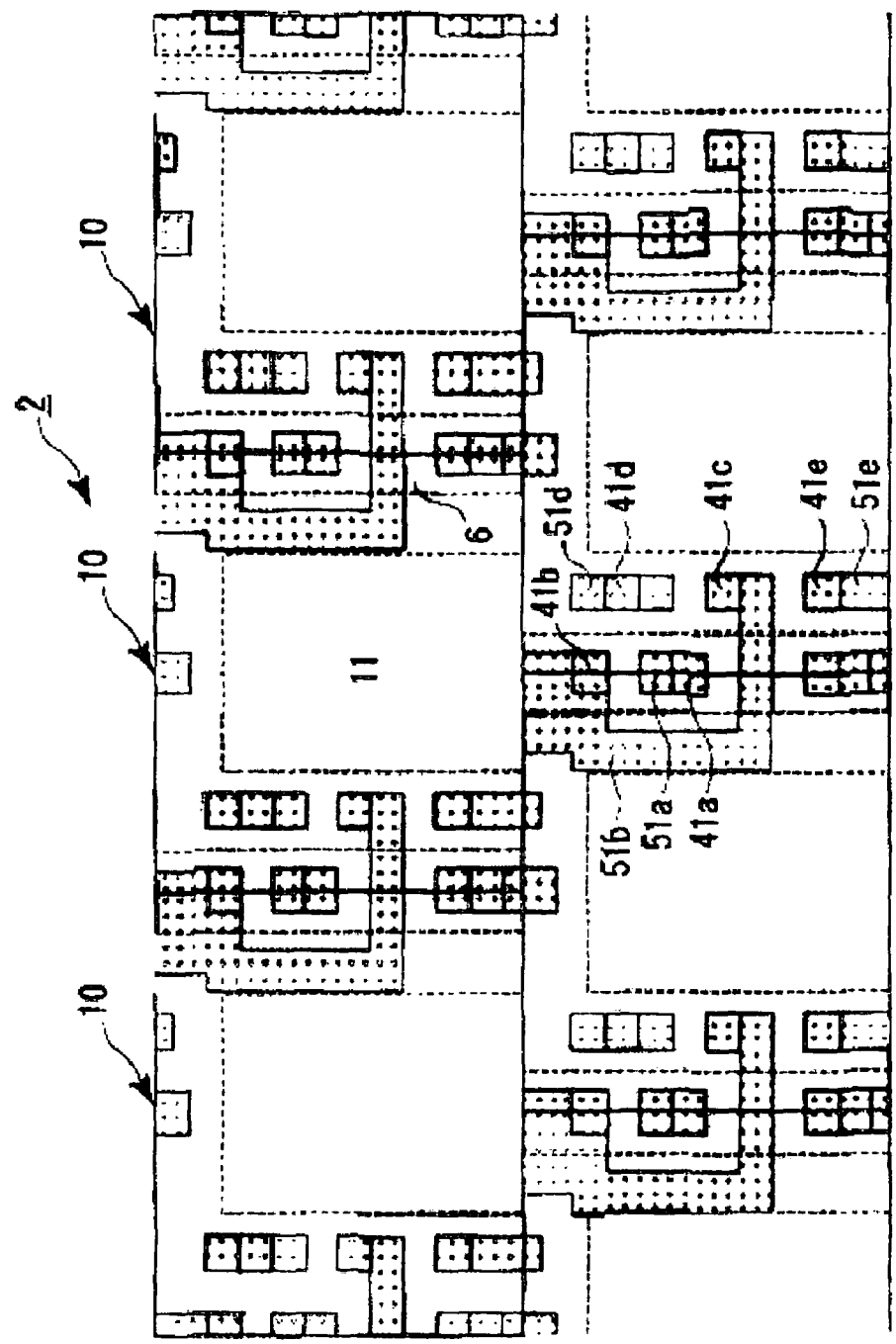
FIG. 5 is a plan view showing a layout of the first metal wiring.
Figure 6:
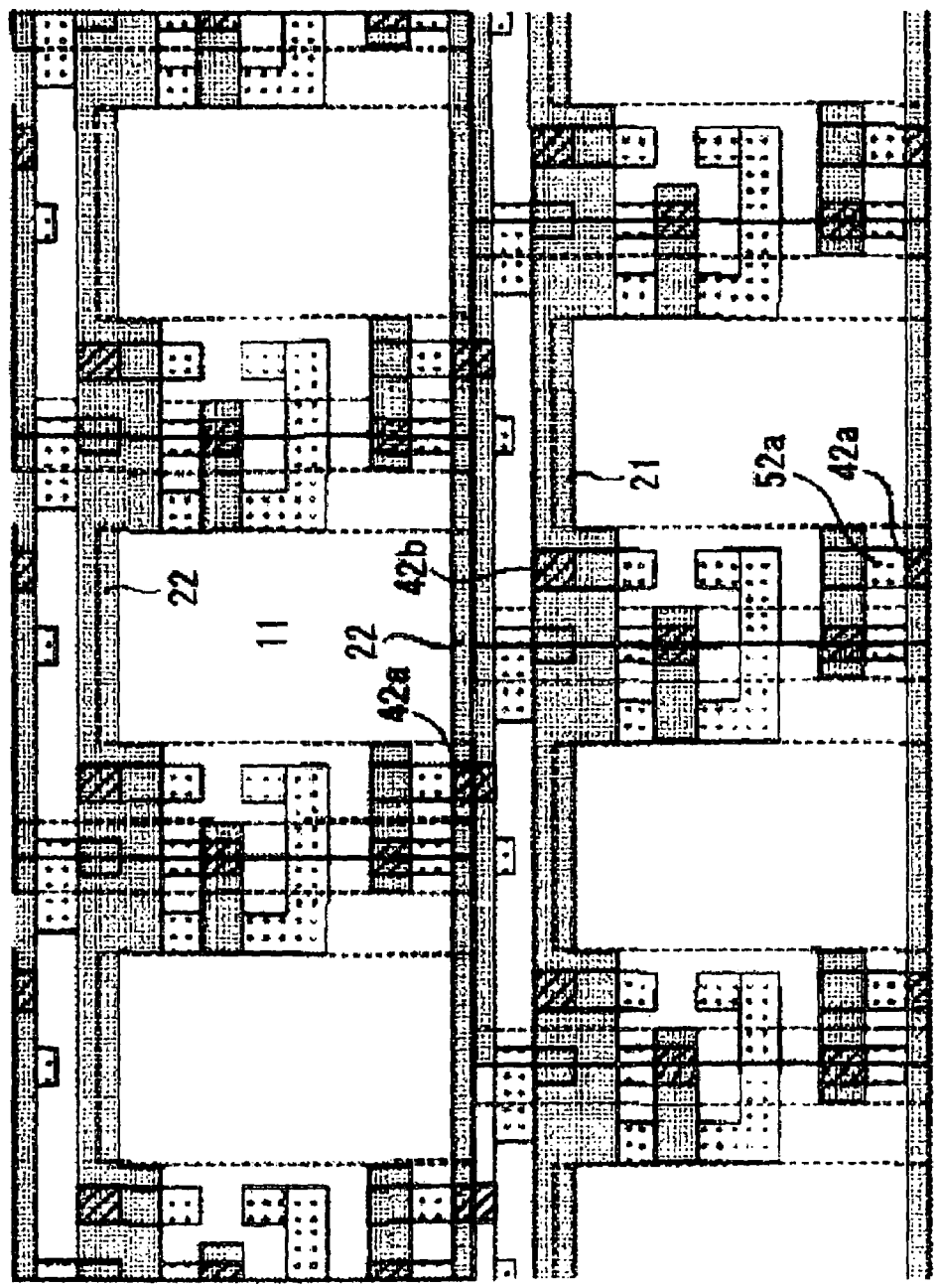
FIG. 6 is a plan view showing a layout of the second metal wiring.
Figure 7:
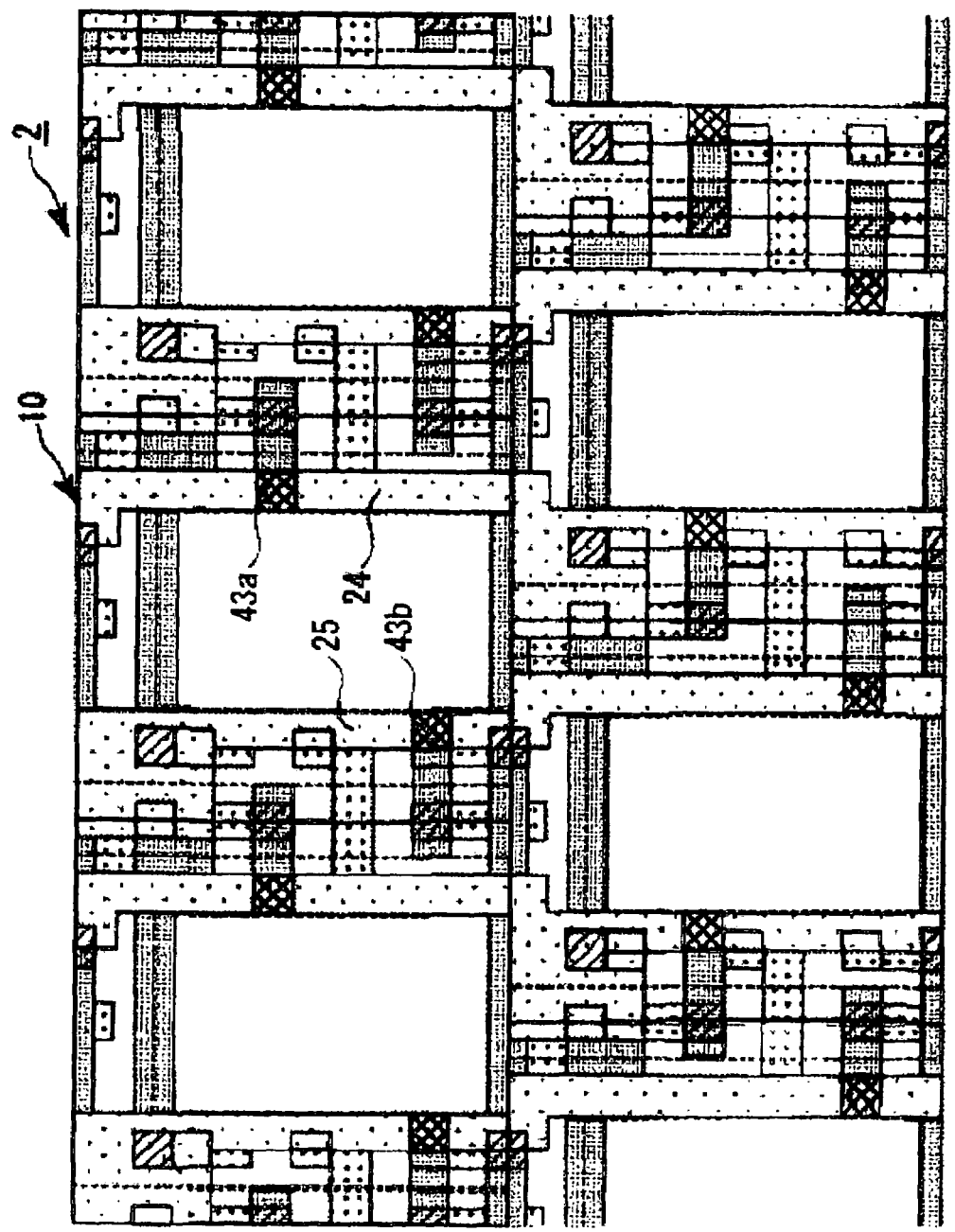
FIG. 7 is a plan view showing a layout of the third metal wiring.

Next, an example of a 3+2 pixel structure that forms the circuit of a 4Tr type CMOS image sensor 1 according to an embodiment of the present invention is shown. FIG. 4 is a plan view showing a layout of the active region and CMOS transistor array in the pixel. FIG. 5 is a plan view showing a layout of the first metal wiring. FIG. 6 is a plan view showing a layout of the second metal wiring. FIG. 7 is a plan view showing a layout of the third metal wiring.

In the present invention, as shown in FIG. 4, in each pixel 10, the PD 11 and the respective CMOS transistors are arrayed in parallel in a row in the column direction. The pixel 10 is made up into a shifted-by-½-pitch type wherein one pixel 10 in one row is shifted by half of the width thereof, in the row direction, relative to another upper one, in the immediately upper row, which is adjacent thereto.

Here, on a silicon substrate 3, there is provided at the center of the pixel 10 defined by relevant element isolation films an active region of rectangular PD 11. An active region of FD 16 is provided in the way that it bridges the boundary between relevant two of the pixels 10 that are adjacent in the row direction.

Further, four CMOS transistors, i.e. the gate electrode of the TG 12, the gate electrode of the RST 13, the gate electrode of the SF-Tr 14, and the gate electrode of the SE 15, are disposed in a row in the column direction. The gate electrode of the TG 12 is disposed in the way that it is continuous to the gate electrode of the SE 15 in the pixel 10 that is adjacent to that relevant pixel 10 in the oblique direction to thereby form one piece of pattern. The gate electrode of the TG 12 that is disposed upper in FIG. 4 commonly connects the gate electrodes of the pixels 10 that are adjacent to each other in the row direction with the TG line 23. Here, according to the above-mentioned operational sequential order, along the active region of FD 16, the PD 11, RST 13, SF-Tr 14, and SE 15 are arrayed in this order. Since, in this way, the CMOS transistors are disposed on a straightforward line, unlike a horizontally thrown U-shaped portion such as that of the conventional CMOS image sensor 1, it is possible to shorten the distance between the transistors, to make large the region of the PD 11, and to enhance the sensitivity. Also, it is possible to make wide the lead portion of the gate electrode and to make less the variation in characteristic of the transistors to decrease the error in the signal.

FIG. 5 shows the first metal wiring layer that is connected to the respective CMOS transistors. This first metal wiring layer has a metal wiring 51b that connects the FD 16 and the SF-Tr 14 gate electrode, from the TG line 23, via a floating diffusion contact plug 18 (hereinafter referred to as "the FD-C") and a contact plug 41b, a metal wiring 51c that is connected to the gate electrode of the RST 13 and the drain region via a contact plug 41c, a metal wiring 51d that is connected to the drain region of the SF-Tr 14 via a contact plug 41d, and a metal wiring 51e that is connected to the source region of the SE 15 via a contact plug 41e.

FIG. 6 shows the second metal wiring layer that is connected to the respective CMOS transistors. This second metal wiring layer has disposed therein the SE line 22 and the RST line 21. The SE line 22 is provided in the way of extending over two of the pixels that are adjacent to each other in the row direction and, further, in the way of extending over and through all the pixels 10 in the row direction. The SE line 22 is connected to the source region of the SE 15 via a contact plug 42a. That layer has disposed therein the RST line 21 that is connected to the gate electrode of the RST 13 via a contact plug 42b. These SE line 22 and RST line 21 are provided in the way of extending over all the pixels 10 in the row direction.

FIG. 7 shows the third metal wiring layer that is connected to the respective CMOS transistors. This third metal wiring layer has disposed therein the power source VR line 24 that is electrically connected to the RST 13 and the drain region of the SF-Tr 14 via a contact plug 43a and the signal read-out line 25 that is connected to the source region of the SE 15 via a contact plug 43b.

Although these first, second, and third metal wiring layers respectively partially light-shield PD11, when they are superposed, they as a whole can light-shield the FD 16. In a case where a signal is not read out using a collective shutter technique, there is no need to provide a light-shielding screen member.

Also, as shown in FIGS. 6 and 7, regarding the metal wiring layers of the pixels 10 that are adjacent to each other in the column direction, one of them is not only shifted by half of the width of the pixel relative to the other in the row direction, but, regarding each of the second and third metal wiring layers, the wiring pattern is made the one wherein the left side part thereof and the right side part thereof are inverted from each other. Especially, as shown in FIG. 7, regarding the signal leading line 25 in the third metal wiring layer, in order to make that line 25 a line that is single in the column direction, the following wiring is performed. Namely, regarding the upper row, the signal leading line 25 is wired on the left side of the pixel while bypassing the PD 11, whereas, regarding the lower row, because the position of the pixel 10 is shifted by half of the width relative to that of the pixel 10 in the upper row, that signal draw-out line 25 is wired on the right side of the PD. For this reason, because the leading line that is drawn out to the signal leading line 25 is drawn out ever row, the pixel on the upper row becomes inverted from the relevant pixel on the lower row in terms of wiring pattern.

Regarding the VR line 24, as well, in the third metal wiring layer, similarly, the wiring patterns of the mutually relevant pixels become inverted.

Embodiment 2

Figure 8:
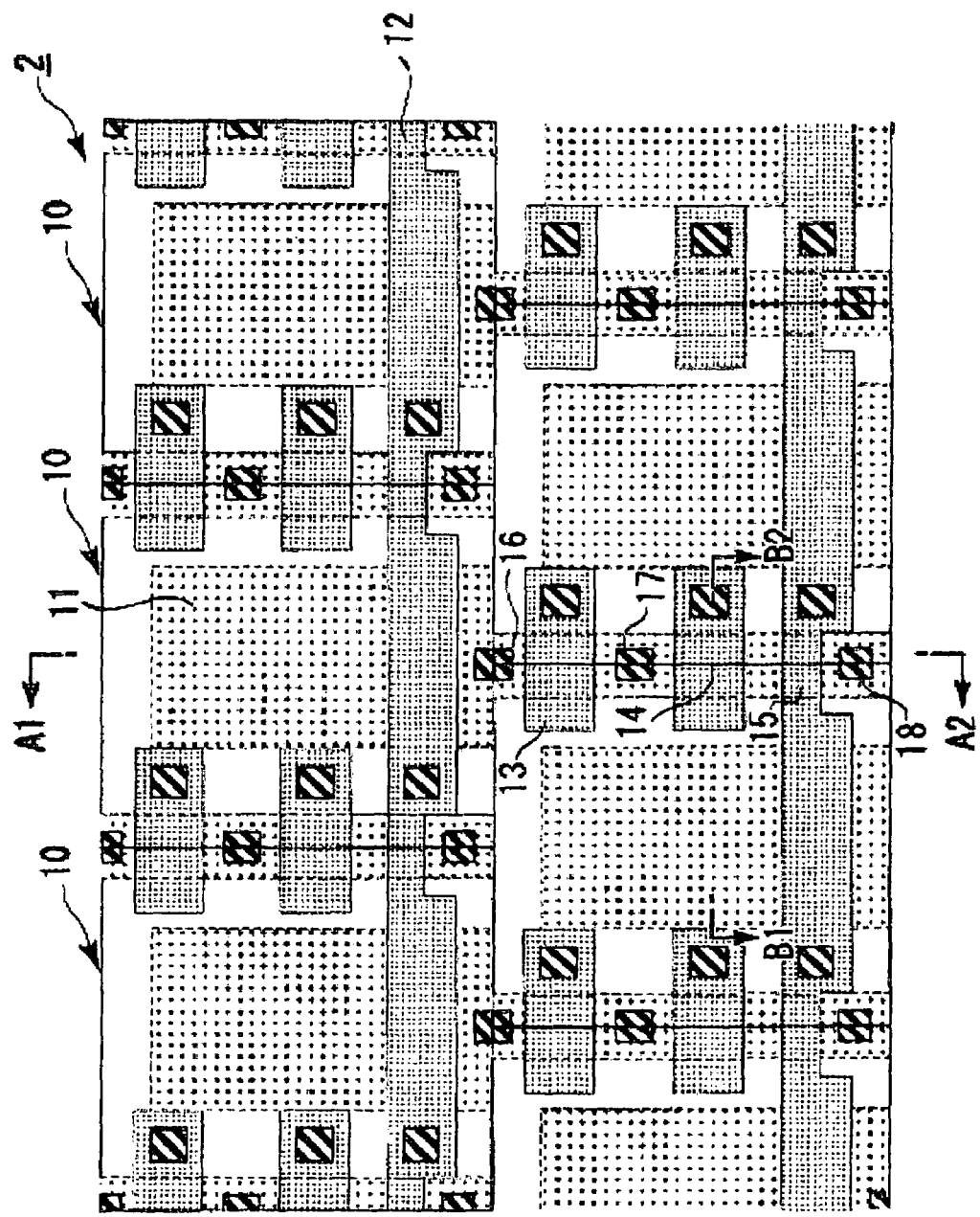
FIG. 8 is a plan view showing a layout of the active region and CMOS transistor array in the pixel.
Figure 9:
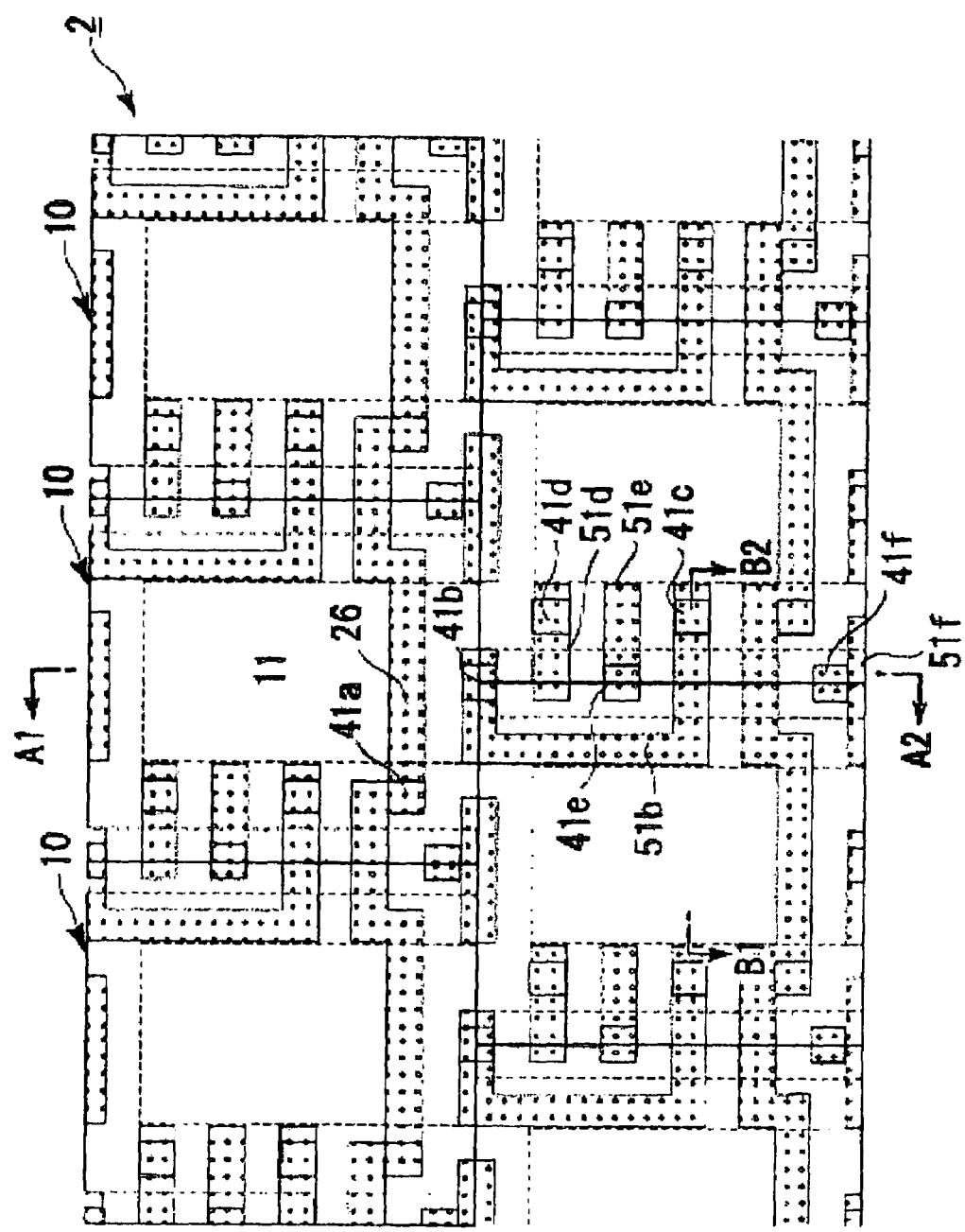
FIG. 9 is a plan view showing a layout of the first metal wiring.
Figure 10:
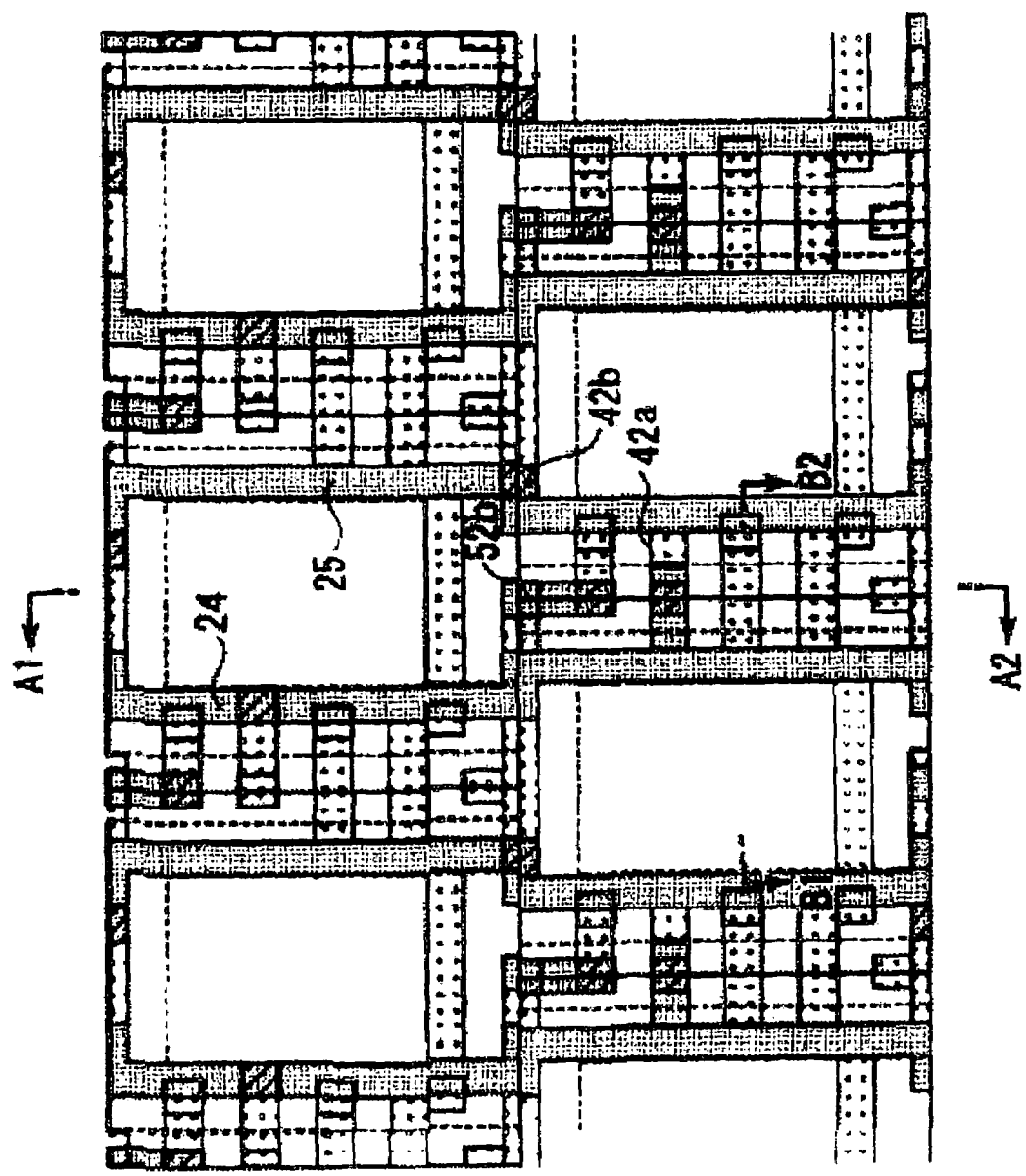
FIG. 10 is a plan view showing a layout of the second metal wiring.
Figure 11:
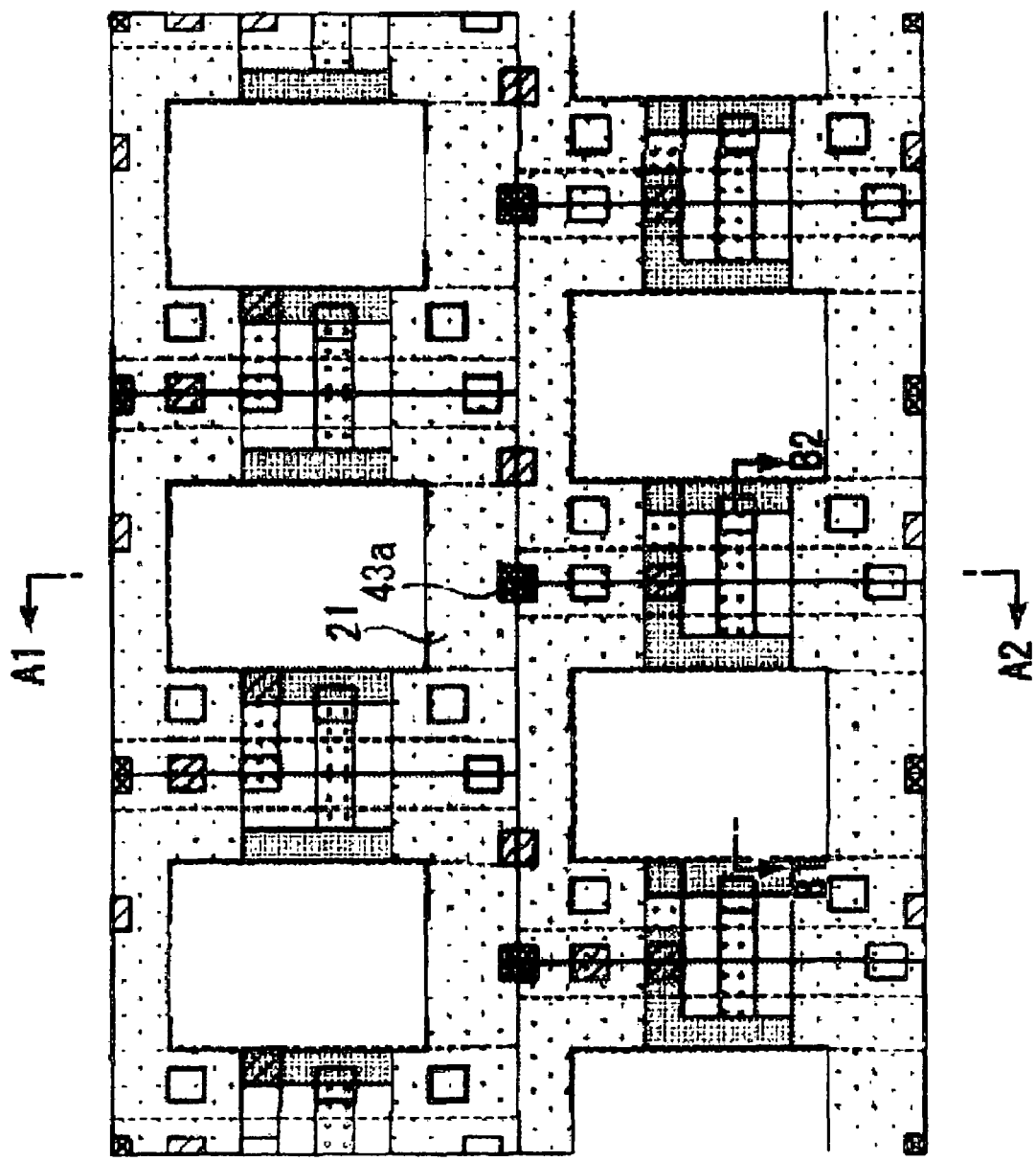
FIG. 11 is a plan view showing a layout of the third metal wiring.

Next, an example of a 3+2 pixel structure that forms the circuit of a 4Tr type CMOS image sensor 1 according to an embodiment of the present invention is shown. FIG. 8 is a plan view showing a layout of the active region and CMOS transistor array in the pixel. FIG. 9 is a plan view showing a layout of the first metal wiring. FIG. 10 is a plan view showing a layout of the second metal wiring. FIG. 11 is a plan view showing a layout of the third metal wiring.

Figure 3:
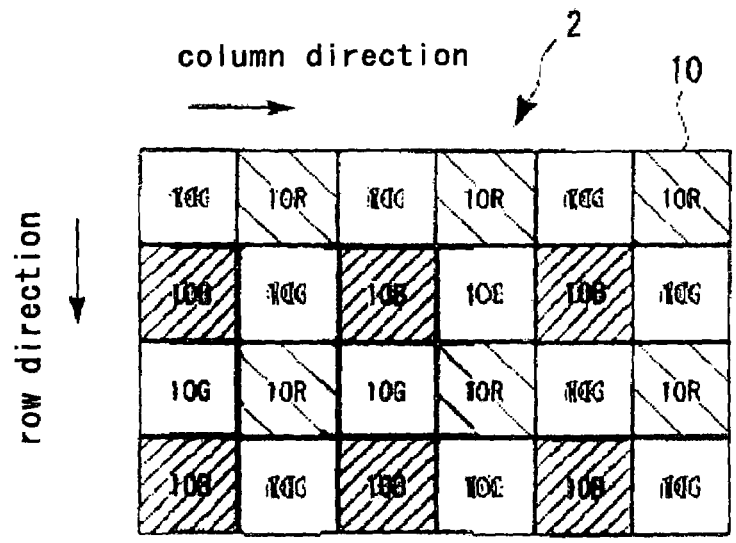
FIGS. 3(a) and 3(b) are typical views showing the array of the pixels in the CMOS image sensor according to the embodiment of the present invention, FIG. 3(a) showing a square arrayed (Bayer) type construction wherein pixels are arrayed in the form of a lattice and FIG. 3(b) being a schematic view showing a shifted-by-½-pitch pixel array type construction wherein pixels are arrayed in the way that each of them is shifted by half of its width every row.
Figure 3:
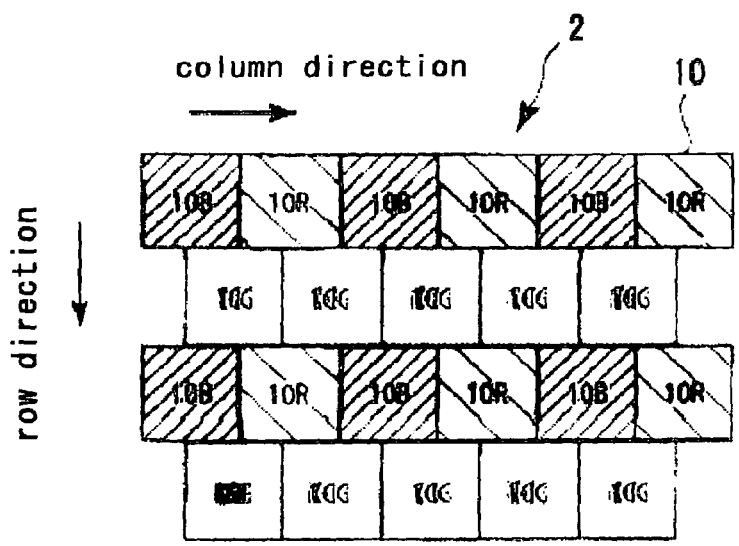

In the present invention, as shown in FIG. 8, in each pixel 10, the PD 11 and respective CMOS transistors which are respectively arrayed in rows in the column direction are arrayed in parallel in the column direction. The pixel 10 is made up into a (shifted-by-½-pitch type) structure wherein one pixel 10 in one row is shifted by half of the width thereof, in the row direction, relative to another upper one which is adjacent thereto in the immediately upper row, every row. Further, as shown in FIG. 3, an SE/TG line 26 to which there are commonly connected the TG line 23 and the SE line 22 is wired in the relevant metal wiring.

Here, as shown in FIG. 8, on a silicon substrate 3, there is provided at the center of the pixel 10 defined by relevant element isolation film an active region of rectangular PD 11. An active region of FD 16 is provided in the way that it bridges the boundary between relevant two of the pixels 10 that are adjacent in the row direction.

Further, four CMOS transistors, i.e. the gate electrode of the RST 13, the gate electrode of the SF-Tr 14, and the gate electrode of the SE 15, are disposed in a row in the row direction. The gate electrode of the TG 12 is disposed in the way that it is continuous to the gate electrode of the SE 15 in the pixel 10 that is adjacent to that relevant pixel 10 in the oblique direction to thereby form one piece of pattern. In the lower part of FIG. 8, there is disposed the SE/TG line 26 to which there are commonly connected the TG line 23 and the SE line 22 using gate material. Since, by shifting the pixel by half of the width thereof every row, the TG 12 and the gate electrode of the SE 15 in the pixel 10 adjacent to that relevant pixel in the column direction approach to each other, the SE/TG line 26 can easily be commonly used. Here, according to the above-mentioned operational sequential order, along the active region of FD 16, the PD 11, RST 13, SF-Tr 14, and SE 15 are arrayed in this order.

Also, for the reason why the SE/TG line 26 has been commonly used, although the size of the PD 11 remains unchanged from that in the case of the first embodiment, it is possible to make great the interval between the respective CMOS transistors of RST 13, SF-Tr 14, and SE 15, to make great the width of each of the transistors, and to make less the error in the signal.

FIG. 9 shows the first metal wiring layer, which has the SE/TG line 26 that is connected to the gate electrode of the TG 11 and the gate electrode of the SE 15 via a contact plug 41$a$, as well as a metal wiring 51$b$ that connects the FD 16 and the gate electrode of the SF-Tr 14, from the FD-C 18, via a contact plug 41$b$ and a contact plug 41$c$. Also, the first wiring layer has a metal wiring 51$d$ that is connected to the gate electrode of the RST 13 and the drain region thereof via a contact plug 41$d$, a metal wiring 51$e$ that is connected to the drain region of the SF-Tr 14 via a contact plug 41$e$, and a metal wiring 51$f$ that is connected to the source region of the SE 15 via a contact plug 41$f$.

FIG. 10 shows the second wiring layer, which has disposed therein the power source VR line 24 that is electrically connected to the drain region of the RST 13 and the drain region of the SF-Tr 14 via a contact plug 42$a$, as well as the signal read-out line 25 that is connected to the source region of the SE 15 via a contact plug 42$b$.

FIG. 11 shows the third metal wiring layer, which has the RST line 21 that is electrically connected to the gate electrode of the RST 13 via a contact plug 43$a$.

Here, the PD 11 and the respective CMOS transistors are arrayed in a row in parallel in the column direction and one pixel in one row is shifted by half of the width thereof, in the row direction, relative to another relevant one in an adjacent row, every row. Further, by the TG line and SE line's 22 in the metal wiring being made common, it is possible to make great the interval between two of the RST 13, SF-Tr 14, and SE 15, to make great the width of each transistor, and to make less the error in the signal. Further, the percentage of the area occupied by the active region of PD 11 in the area of the whole pixel 10 can be made as very high as 40%. Accordingly, it is possible to enhance the sensitivity of the CMOS transistor. Also, the electric wiring, contact plugs, etc. are provided concentratedly at the peripheral edge part of the pixel 10, and it is therefore possible to increase the freedom in which the electric wiring, etc. can be laid out when disposed.

Also, here, a method of manufacturing the photographing apparatus that embodies the present invention will be explained below.

Figure 12:
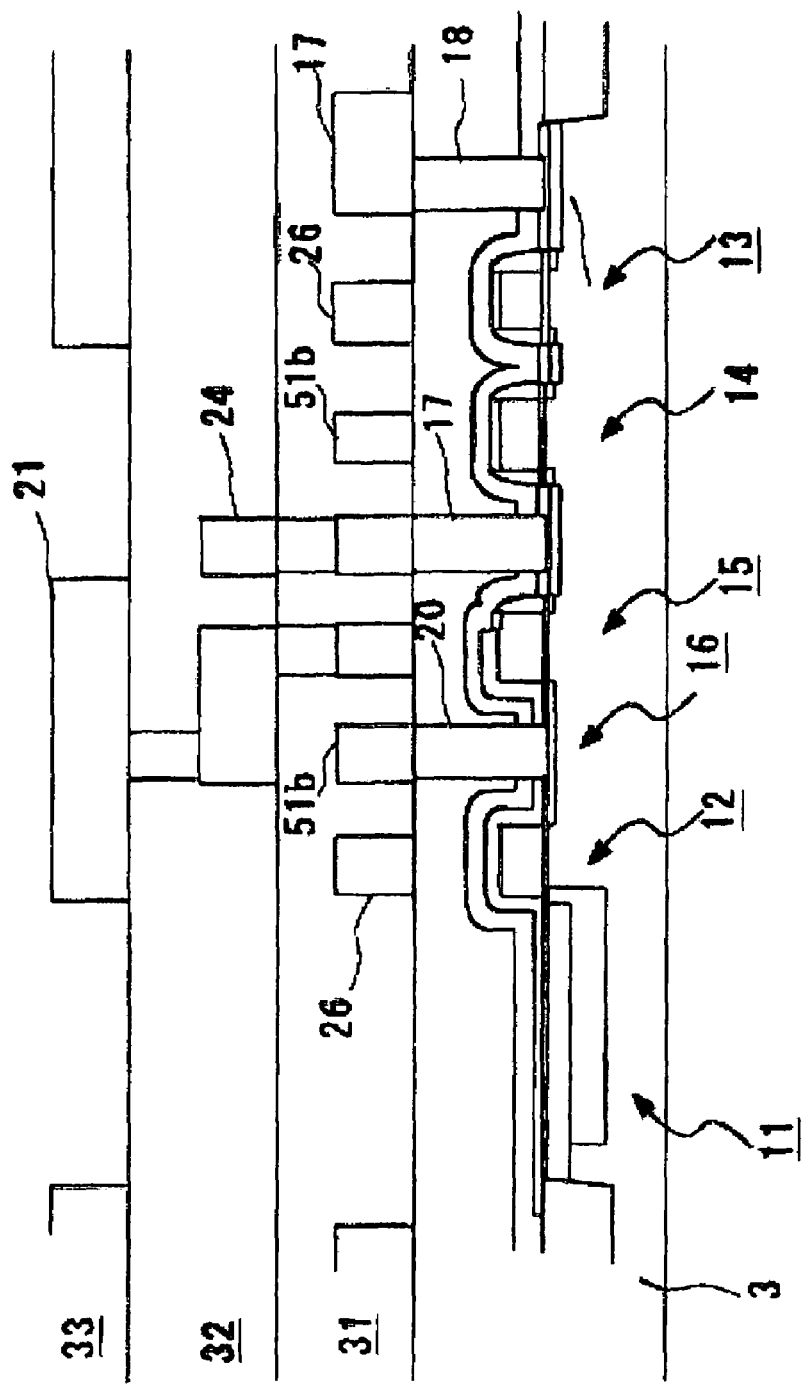
FIG. 12 is a view showing the structure of a section taken along a sectional line A1-A2 in each of FIGS. 8 to 12.
Figure 13:
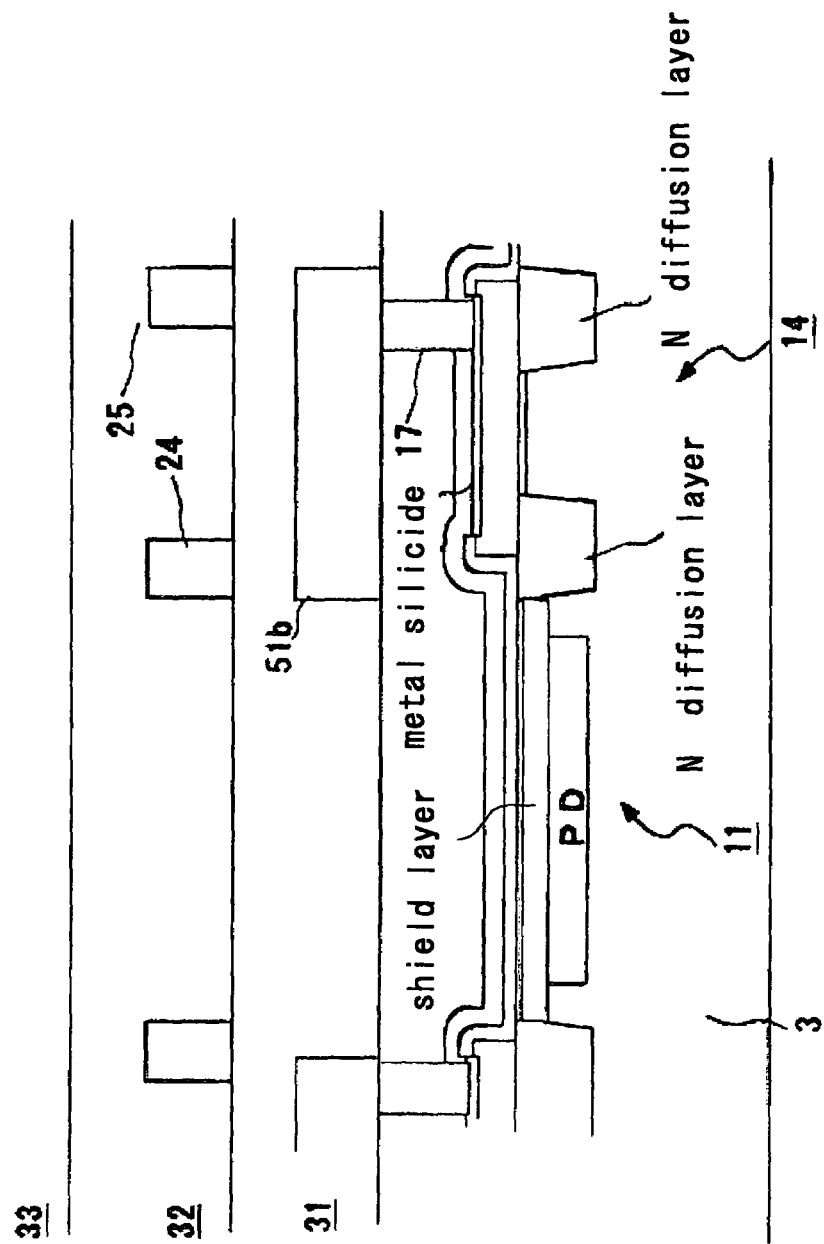
FIG. 13 is a view showing the structure of a section taken along a sectional line B1-B2 in each of FIGS. 8 to 12.

FIG. 12 is a view showing the structure of a section taken along a sectional line A1-A2 in FIGS. 8 to 12. FIG. 13 is a view showing the structure of a section taken along a sectional line B1-B2 in FIGS. 8 to 12.

First, the CMOS image sensor has a feature in that it can be manufactured on a silicon substrate 3 in the same way as in the process steps for manufacturing an ordinary semiconductor apparatus.

For instance, element isolation films having a thickness of approximately 250 to approximately 350 nm are formed. By doing so, in each pixel, there is formed an active region having a prescribed pattern. The element isolation film 71 can be formed using a LOCOS technique or STI (Shallow Trench Isolation) technique.

Subsequently, on the silicon substrate 3 there is formed a prescribed well region. Incidentally, in the pixel 10, since an N-type transistor is formed, a P well region is formed.

Subsequently, on the active region that has been defined by the element isolation film 71, using a thermal-oxidation technique, there is formed a gate-insulating film that consists of a silicon oxide film the thickness of that is in a range of from approximately 3 to approximately 8 nm.

Subsequently, using, for example, a CVD technique, there are sequentially deposited a phosphorus-doped poly-silicon film the thickness of that is in a range of from 50 to 100 nm, a tungsten silicide film the thickness of that is in a range of from 100 to 200 nm, and a silicon oxide film the thickness of that is in a range of from 100 to 200 nm.

Subsequently, by photolithography and dry etching, the silicon oxide film, tungsten silicide film, and polysilicon film are patterned to form a gate electrode of a polycide structure the upper surface of that is covered by the silicon oxide film 26. At this time, the gate electrode of the TG is formed by a single pattern wherein it is continuous to the gate electrode of the SE in the pixel adjacent in the column direction.

Subsequently, using the gate electrode as a mask, ion implantation of, for example, phosphorus ion is performed with an acceleration energy of 10 to 30 keV and a dose of $2 \times 10^{13}$ to $1 \times 10^{14}$ cm$^{-2}$ to form an impurity diffusion region that becomes an LDD region of the N-type transistor.

Subsequently, with respect to a region for forming the PD, ion implantation of, for example, phosphorus ion is performed with an acceleration energy of 20 to 200 keV and a dose of $1 \times 10^{12}$ to $5 \times 10^{13}$ cm$^{-2}$ to form a buried N-type layer 32. It is to be noted that the element isolation film 71 and the buried N-type layer 32 are spaced by approximately 0.2 µm from each other. On the other hand, the buried N-type layer is formed, on a self-aligned basis, with respect to the gate electrode of the TG.

Incidentally, since in the FD it is demanded, as in the case of the PD-forming region, that junction leak be less, it may be arranged that, with respect to a region, as well, for forming the FD, the buried N-type layer be formed. From the viewpoint of further decreasing the junction leak in the FD, it may be arranged that, with respect to only the FD region alone, ion implantation of, for example, phosphorus ion be performed with an acceleration energy of 10 to 30 keV with a dose that is as high in concentration as approximately $1 \times 10^{14}$ to $5 \times 10^{15}$ cm$^{-2}$.

Subsequently, with respect to the PD-forming region, ion implantation of, for example, boron ion is performed with an acceleration energy of 5 to 10 keV and a dose of $1×10^{13}$ to $1×10^{14}$ cm$^{-2}$, or, ion implantation of, for example, BF$_2$ is performed with an acceleration energy of 30 keV and a dose of $1×10^{13}$ to $1×10^{14}$ cm$^{-2}$, to form a P⁺layer on the surface side of the PD-forming region. Incidentally, the P⁺ layer can be formed simultaneously with an impurity diffusion region that becomes the LDD region of a P-type transistor not shown.

Subsequently, using, for example, CVD technique, a silicon oxide film the thickness of that is in a range of from 50 to 150 nm is formed.

Subsequently, with the use of a photolithography, a mask that covers the PD region and FD region is formed. Thereafter, the silicon oxide film is anisotropic-etched to form on the side wall of the gate electrode a side wall insulation film that consists of the silicon oxide film and simultaneously leave the silicon oxide film remaining on the PD region and FD region.

Subsequently, using the gate electrode, silicon oxide film, and side wall insulation film as a mask, ion implantation of, for example, phosphorus ion is performed with an acceleration energy of 10 to 30 keV and a dose of 1 to $5×10^{15}$ cm$^{-2}$ to form a high-concentration impurity diffusion region 40 that becomes the source/drain region of the N-type transistor.

Also, with respect to the P-type transistor-forming region not shown, ion implantation of, for example, boron ion is performed with an acceleration energy of 5 to 10 keV and a dose of 1 to $5×10^{15}$ cm$^{-2}$ to form a high-concentration impurity diffusion region that becomes the source/drain region of the P-type transistor.

Subsequently, for example, using a sputtering technique, a titanium film or a cobalt film is deposited and then RTA heat treatment is performed with respect to the resulting structure. Then, the titanium film or cobalt film that remains in a reaction-free state is removed. By doing so, on the region whose surface has silicon exposed there is selectively formed a metal silicide film. At this time, since the silicon oxide film is kept formed on the PD region and FD region, the metal silicide film is not formed.

Subsequently, using, for example, a plasma CVD technique, a silicon nitride film or silicon nitride oxide film the thickness of that is in a range of from 50 to 200 nm and a silicon oxide film the thickness of that is in a range of from 700 to 1500 nm is deposited.

Subsequently, using, for example, a CMP technique, polishing is performed of the surface of the silicon oxide film to flatten that surface.

Subsequently, by photolithography and dry etching, in the silicon oxide film and silicon nitride film, there are formed contact holes that reach the metal silicide film formed on the gate electrode or source/drain diffusion layer.

Subsequently, using, for example, a CVD technique, there are deposited a titanium film having a thickness of 10 to 50 nm, a titanium nitride film having a thickness of 10 to 100 nm, and a tungsten film having a thickness of 100 to 800 nm. Thereafter, these films are polished using a CMP technique until the silicon oxide film gets exposed to form contact plugs that are buried in the contact holes.

Subsequently, using, for example, a sputtering technique, an aluminum alloy layer having a thickness of 400 to 1000 nm is deposited onto the silicon oxide film having buried therein the contact plugs, and patterning is performed with respect to that aluminum alloy to form the first metal wiring layer 31.

Subsequently, depositing an intra-layer insulating film, forming a via hole, and forming a wiring layer are repeatedly performed. By doing so, there are formed the second metal wiring layer that is connected to the first metal wiring layer via the contact plug buried in the intra-layer insulating film and the third metal wiring layer that is connected to the second metal wiring layer via the contact plug buried in the intra-layer insulating film.

In this way, according to this embodiment, since the gate electrode of the TG and the gate electrode of the SE are formed in the form of one continuous pattern, it is possible to reduce, one piece in number, the contact holes for permitting connection of the first metal wiring layer to a layer that is lower. As a result of this, it is possible to increase the allowance when laying out the metal wiring layers. Also, since allowance is made in terms of area, widening the area of the FD-forming region becomes possible. This enables decreasing the junction leak. Also, it is possible to make great the width of the gate of the transfer transistor.

Also, since in the third metal wiring layer it is only needed to construct the RST line, that layer can be utilized as a light-shielding film member for light-shielding the floating diffusion region. Accordingly, even when reading out by the collective-shutter method, it is possible to obtain an excellent image that is free from "blurring" and "distortion"

Embodiment 3

Figure 14:
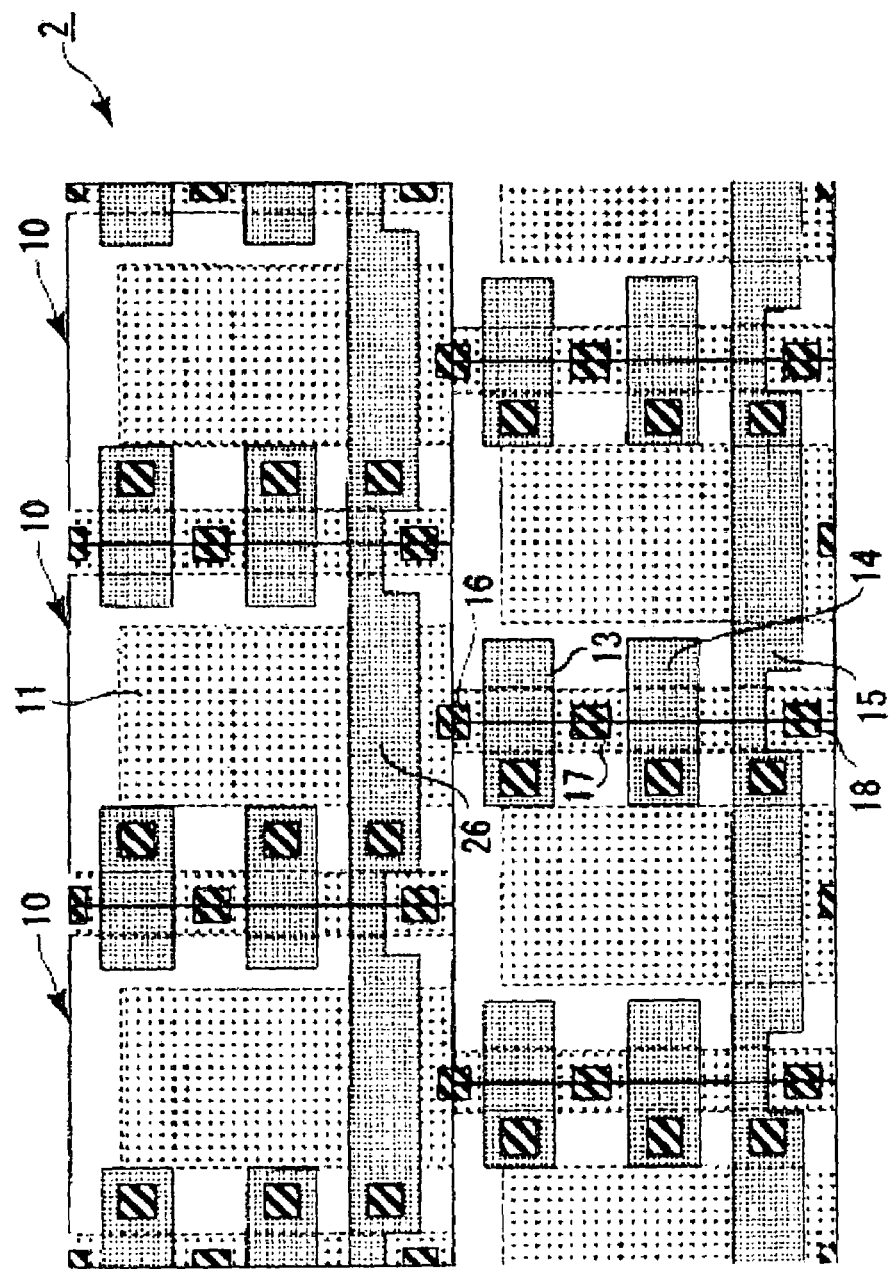
FIG. 14 is a plan view showing a layout of the active region and CMOS transistor array in the pixel.
Figure 15:
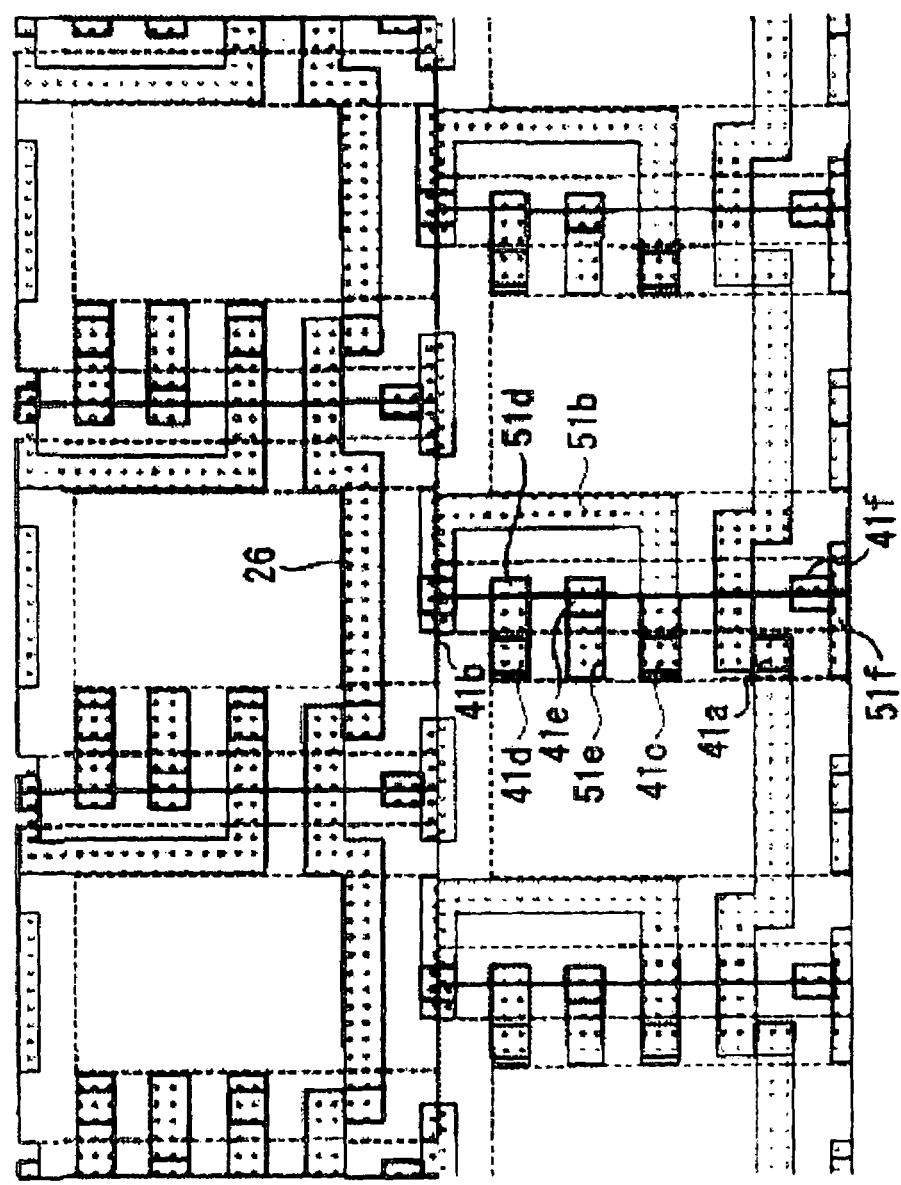
FIG. 15 is a plan view showing a layout of the first metal wiring.
Figure 16:
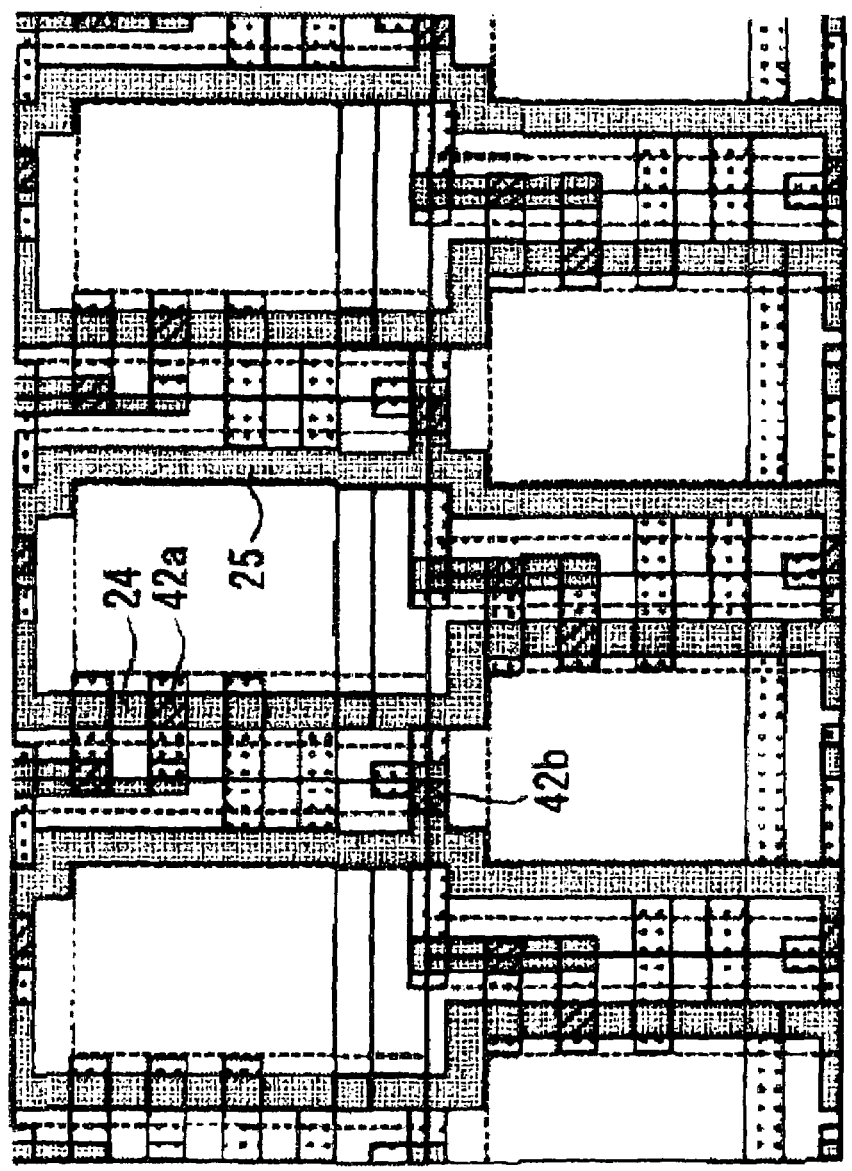
FIG. 16 is a plan view showing a layout of the second metal wiring.
Figure 17:
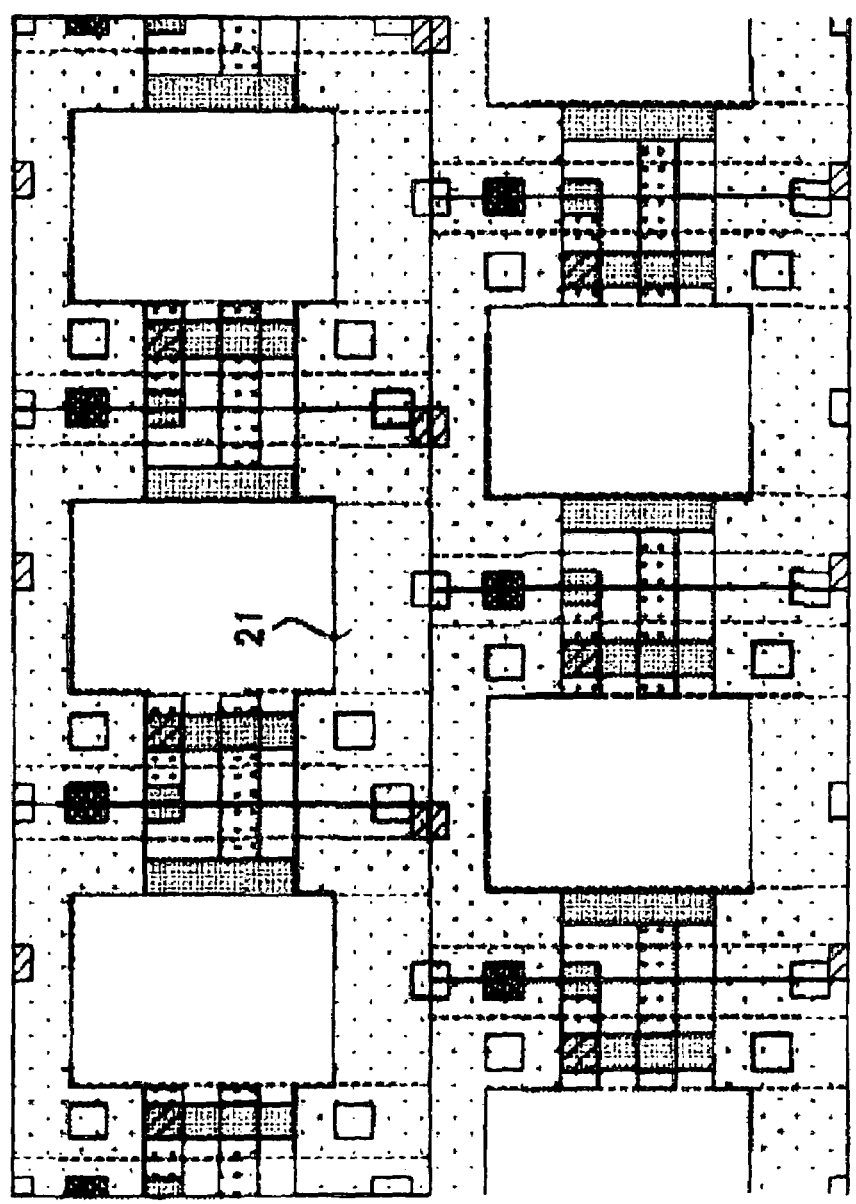
FIG. 17 is a plan view showing a layout of the third metal wiring.

Next, an example of a 3+2 pixel structure that forms the circuit of a 4Tr type CMOS image sensor 1 according to an embodiment of the present invention is shown next. FIG. 14 is a plan view showing a layout of the active region and CMOS transistor array in the pixel. FIG. 15 is a plan view showing a layout of the first metal wiring. FIG. 16 is a plan view showing a layout of the second metal wiring. FIG. 17 is a plan view showing a layout of the third metal wiring. The PD 11 and respective CMOS transistors are arrayed in parallel in the column direction. The pixel 10 is shifted by half the width thereof (a shifted-by-½-pitch type) every row, thereby the left side/right side of the pattern of PD 11 and CMOS are inverted every row. Further, of the metal wiring, the TG line 23 and SE line 22 are each made common.

Here, as shown in FIG. 14, on a silicon substrate 3, there is provided at the center of the pixel 10 defined by relevant element isolation films an active region of rectangular PD 11. Also, an active region of FD 16 is provided in the way that it bridges the boundary between relevant two of the pixels 10 that are adjacent in the row direction.

Also, four CMOS transistors, i.e. the gate electrode of the RST 13, the gate electrode of the SF-Tr 14, and the gate electrode of the SE 15, are vertically disposed in a row in the column direction. The gate electrode of the TG 12 is disposed in the way that it is continuous to the gate electrode of the SE 15 in the pixel 10 that is adjacent in the oblique direction to form one piece of pattern. Further, the CMOS transistors the left side/right side of whose pattern are inverted every row. Also, in the lower part of the pixel 10, there is disposed the SE/TG line 26 which is made common to the TG line 23 and the SE line 22 using gate material. Since, by shifting the pixel by half of the width thereof every row, the TG 12 and the gate electrode of the SE 15 in the pixel 10 adjacent in the column direction approach to each other, the SE/TG line 26 can easily be made common.

Also, for the reason why the SE/TG line 26 has been commonly used, although the size of the PD 11 remains unchanged from that in the case of the first embodiment, it is possible to make great the interval between the respective CMOS transistors of RST 13, SF-Tr 14, and SE 15, to make great the width of each of the transistors, and to make less the error in the signal.

FIG. 15 shows the first metal wiring layer, which has the SE/TG line 26 that is connected to the gate electrode of the TG 12 and the gate electrode of the SE 15 via the contact plug 41*a*, as well as a metal wiring 51*b* that connects the FD 16 and the gate electrode of the SF-Tr 14 via the contact plug 41*b* and contact plug 41*c*. Also, the first wiring layer has a metal wiring 51*d* that is connected to the gate electrode of the RST 13 and the drain region thereof via the contact plug 41*d*, a metal wiring 51*e* that is connected to the drain region of the SF-Tr 14 via the contact plug 41*e*, and a metal wiring 51*f* that is connected to the source region of the SE 15 via the contact plug 41*f*.

Here, correspondingly to the fact that the left side/right side of the pattern of PD 11 and respective CMOS transistors are inverted every row, the first wiring layer also forms a pattern that is inverted every row. Also, for the reason why the SE/TG line 26 has been commonly used, although the size of the PD 11 remains unchanged from that in the case of the first embodiment, it is possible to make great the interval between the respective CMOS transistors of RST 13, SF-Tr 14, and SE 15, to make great the width of each of the transistors, and to make less the error in the signal.

In FIG. 16, the second metal wiring layer has disposed the power source VR line 24 that is electrically connected to the drain region of the RST 13 and the drain region of the SF-Tr 14 via the contact plug 42*a* and the signal read-out line 25 that is connected to the source region of the SE 15 via the contact plug 42*b*.

Regarding the signal read-out line 24 in the second metal wiring layer, in order to make that line 24 a line that is single in the column direction, the following wiring is performed. Namely, regarding the upper row, the signal read-out line 24 is wired while bypassing the PD 11 and therefore is provided on the right side of the PD 11, whereas, regarding the lower row, because the position of the pixel 10 is shifted by half of the width relative to that of the pixel 10 in the upside row, that signal read-out line 24 is wired on the left side of the PD 11. And, the line 24 is connected to the source region of the SE 15 via the contact plug 42*b* by means of a short leader for making electrical contact.

Regarding the VR line 24, as well, in the second metal wiring layer, similarly, regarding the upper row, the VR line 24 is wired while bypassing the PD 11 and therefore is provided on the left side of the PD 11, whereas, regarding the lower row, because the position of the pixel 10 is shifted by half of the width relative to that of the pixel 10 in the upside row, that VR 24 is wired on the right side of the PD 11. In addition, because the left/right sides of the pattern of CMOS transistors are inverted every row, the line 24 can be connected without providing a leader for electrical contact. Accordingly, here, as well, correspondingly to the fact that the left side/right side of the pattern of PD 11 and respective CMOS transistors are inverted every row, the first wiring layer also forms a pattern wherein the left and right are inverted every row.

FIG. 17 shows the third metal wiring layer, which has the RST line 21 that is electrically connected to the gate electrode of the RST 13 via the contact plug 53*a* so as to light-shield the active region of FD 16.

Here, the PD 11 and the respective CMOS transistors are arrayed in a row in parallel in the column direction and one pixel in one row is shifted by half of the width thereof, in the row direction, relative to another relevant one in an adjacent row, every row. And, the array of the PD 11 and respective CMOS transistors has its left and right inverted every row. Therefore, it is possible to make small the occupied area of the electric wiring and make large the occupied area of the PD 11. Further, by the TG line 23 and SE line's 22 in the metal wiring being made common, it is possible to make great the interval between two of the RST 13, SF-Tr 14, and SE 15 transistors, to make great the width of each transistor, and to make less the error in the signal.

Embodiment 4

Figure 18:
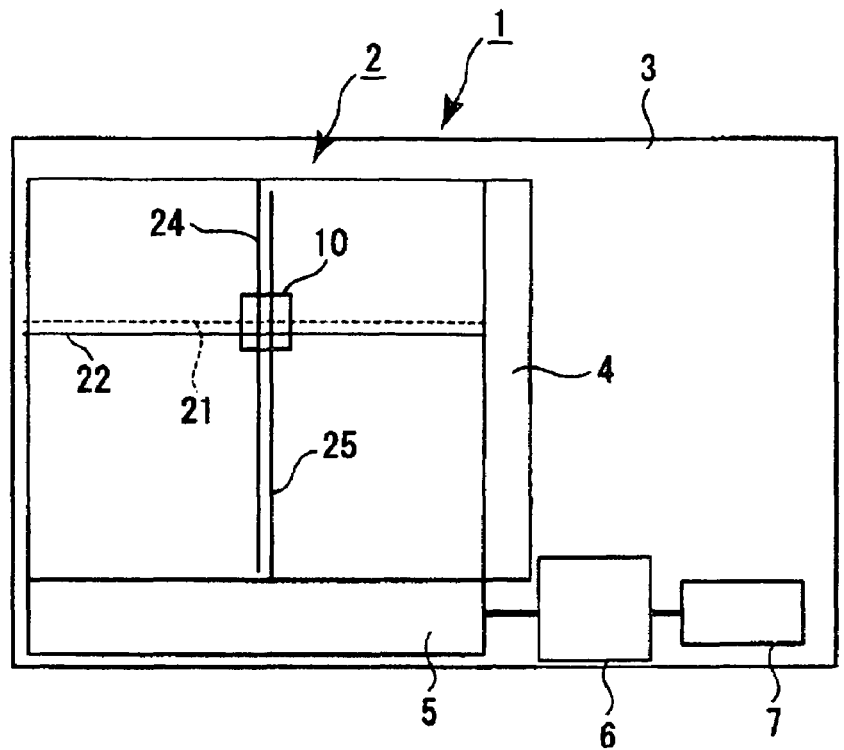
FIG. 18 is a circuit diagram showing a single piece of pixel in the CMOS image sensor according to an embodiment of the present invention.
Figure 19:
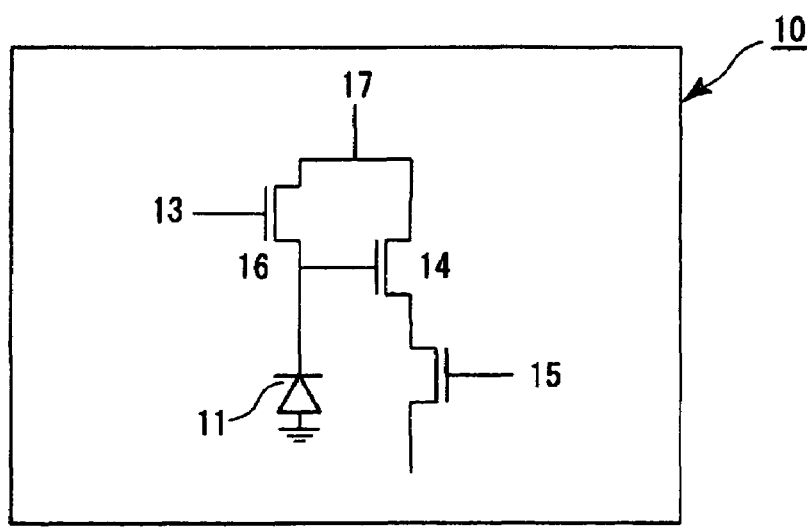
FIG. 19 is a circuit diagram showing the CMOS image sensor according to the embodiment of the present invention.

Next, illustration is made of a CMOS image sensor 1 which is comprised of the PD 11 and three CMOS transistors and in which the PD 11 and respective CMOS transistors are arrayed in parallel in a row in the column direction. FIG. 18 is a circuit diagram showing a single piece of pixel in the CMOS image sensor according to an embodiment of the present invention. FIG. 19 is a circuit diagram showing the CMOS image sensor according to the embodiment of the present invention.

As shown in FIG. 18, the photographing apparatus has formed therein a pixel 10 (hereinafter referred to simply as "the 3TR type") that is constructed of the PD 11 that is one photo-electric conversion element and the three CMOS transistors one of which is the RST 13 that is the first transistor, a second one of which is the SF-Tr 14 that is the second transistor, and a third one of which is the SE 15 that is the third transistor. The cathode terminal of the PD 11 is connected to the source terminal of the RST 13 and to the gate terminal of the SF-Tr 14. The source terminal of the SF-Tr 14 is connected to the drain terminal of the SE 15. Also, the gate terminals of the RST's 13 in the pixels 10 adjacent in the row direction are connected by means of the RST line 21. This RST line 21 is extended in the row direction and is connected to the row selection circuit 4. Also, the SE line 22 which connects the gate terminals of the SE's 15 in the pixel 10 is connected to the circuit, and the SE line 22 is extended in the row direction and connected to the row selection circuit 4. Also, the signal read-out line 25 that commonly connects the source terminals of the SE's 15 in the pixels 10 that are adjacent in the column direction, as well as the VR line 24 that commonly connects the drain terminal of the RST 13 and the drain terminal of the SF-Tr 14, is connected.

Further, the RST line 21 and the SE line 22 are each extended in the row direction and are each connected to the row selection circuit 4. Also, the signal read-out line 25 is connected to the signal read-out/noise cancel circuit. Further, the signal read-out/noise cancel circuit 6 is connected to the output circuit 7 via the amplifier and AD converter 6. The VR line 24 is connected to the reset power source VR 17 that supplies a desired power source voltage.

The operation of the 3Tr type image sensor will now be explained. It is now assumed that every CMOS transistor be of an N type; and each CMOS transistor gets turned on when its gate potential is high in level while the CMOS transistor gets turned off when its gate potential is low in level. First, a signal is applied to every one of the whole RST lines 21 and every one of the whole SE lines 22 to collectively reset the PD's 11 and FD's 16 on the whole lines. As a result of this, each of the PD's 11 and FD's 16 is reset to a state of its voltage being increased up to a prescribed value. Subsequently, unlike the 4Tr type, because the TG 12 is not provided, while no signal from the TG 12 is being available, reception of light by the PD 11 is started, electric charge comes up in the PD 11, and the voltage of the PD 11 is gradually decreased.

Subsequently, the electric charge within the PD 11 is transferred to the FD 16. As a result of this, the voltage of the FD 16 is decreased by the level corresponding to the transferred amount of electric charge. At this time, preferably, the SE 15 also is turned on to leave the signal read-out line 25 kept in a state of high impedance that is kept electrically disconnected from the surrounding read-out circuit part.

Subsequently, the read-out operation will be sequentially done. In order to perform read-out operation, a select signal is applied to the SE lines 22. By this, a voltage that is obtained by subtracting the changed amount ΔV of voltage that corresponds to the amount of charge that had theretofore been accumulated in each PD 11 is output onto the signal read-out line 25.

Subsequently, when a reset signal is applied to the RST lines 21, the FD 16 is reset and its voltage gets stabilized to the prescribed value that reflects the reset voltage VR 17. This voltage is applied to the gate terminal of the SF-Tr 14. When, in that state, a select signal is applied to the SE lines 22, a voltage is output onto the signal read-out line 25. Subsequently, through the operation of the signal read-out/noise cancel circuit 5, the difference between the VR read-out voltage and the signal read-out voltage is determined to obtain the changed amount ΔV of voltage. In this way, the changed amount of voltage that corresponds to the amount of electric charge that had been accumulated until that time in the PD 11 through its reaction made with respect to the amount of light can be accurately read out.

In this way, while, in the 3Tr type, unlike the 4Tr type, because of the TG's 12 being not provided, the amount of electric charge that has come up in the PD 11 is transferred into the FD 16, even after that photographing operation, electric chare still comes up in the PD 11 that has received light. Therefore, measurement is made by resetting the FD 16, etc. every row. For this reason, when performing photographing by and as the CMOS image sensor 1 as a whole that involves therein a time difference that occurs every row when measurement is performed. However, by the extent to which the number of CMOS transistors is less, the structure becomes simplified. Also, by the occupied-area percentage's of the PD 11 being made high, it is possible to enhance the sensitivity. In the 4Tr type structure, it is possible to determine the time at which the amount of electric charge that has come up in the PD 11 is transferred, by the TG 12.

The reason for this is as follows. Namely, after photographing is performed, collectively, by and as the CMOS image sensor as a whole, the TG12 is turned off to prevent new electric charge from being transferred from the PD 11 into the FD 11. The amount of electric charge that was accumulated in the FD 16 before that time is sequentially read in. By doing so, it is possible to make zero the difference in photographing time between each two of the rows. By making zero that time difference, it is possible to make zero the "distortion" and "blurring" of the image that has been photographed.

Figure 20:
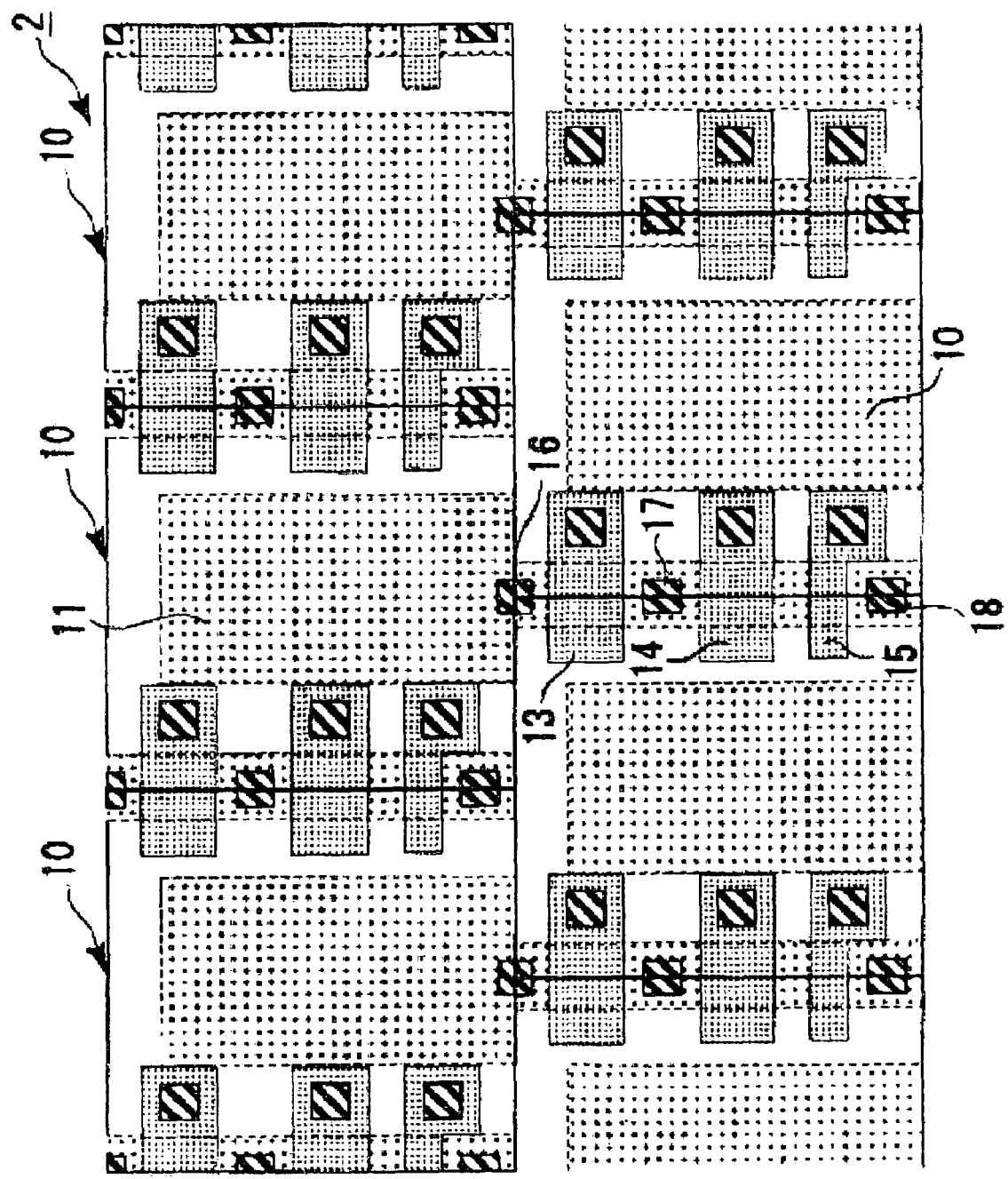
FIG. 20 is a plan view showing a layout of the active region and CMOS transistor array in the pixel.
Figure 21:
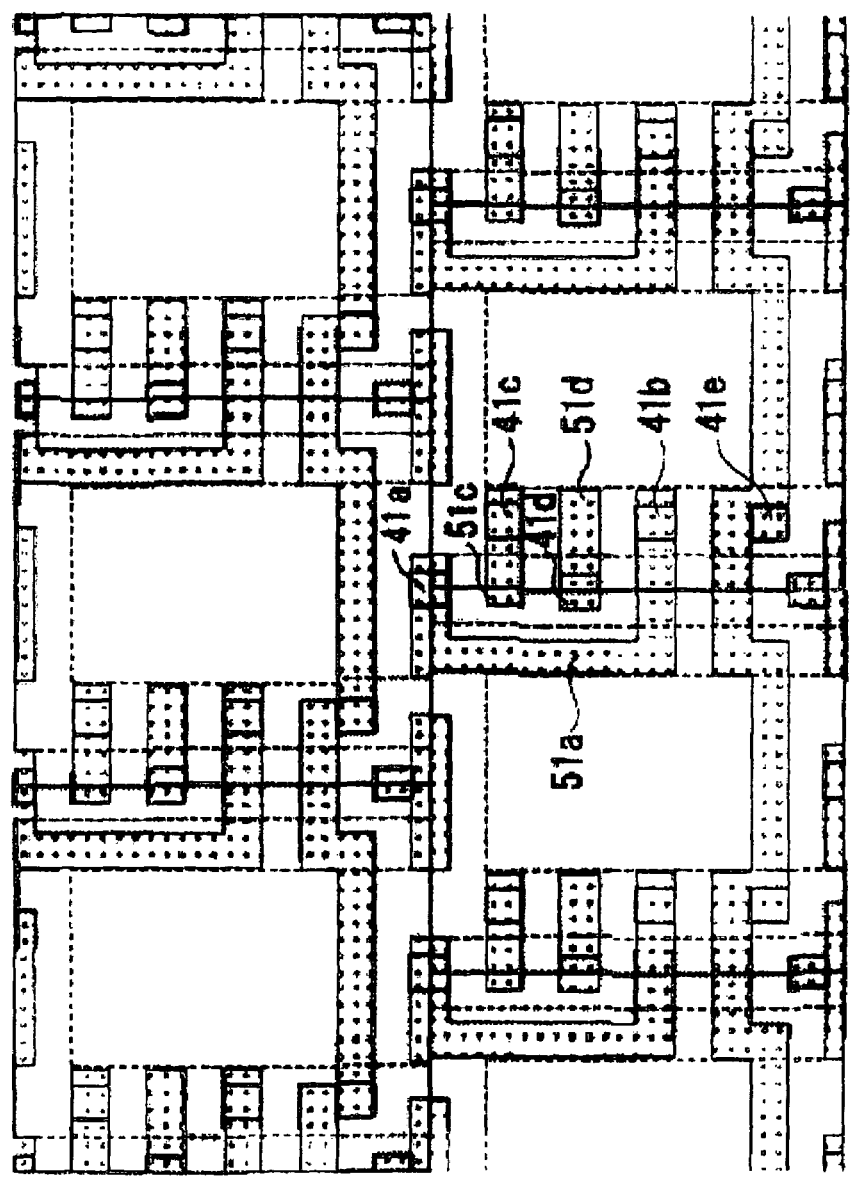
FIG. 21 is a plan view showing a layout of the first metal wiring.
Figure 22:
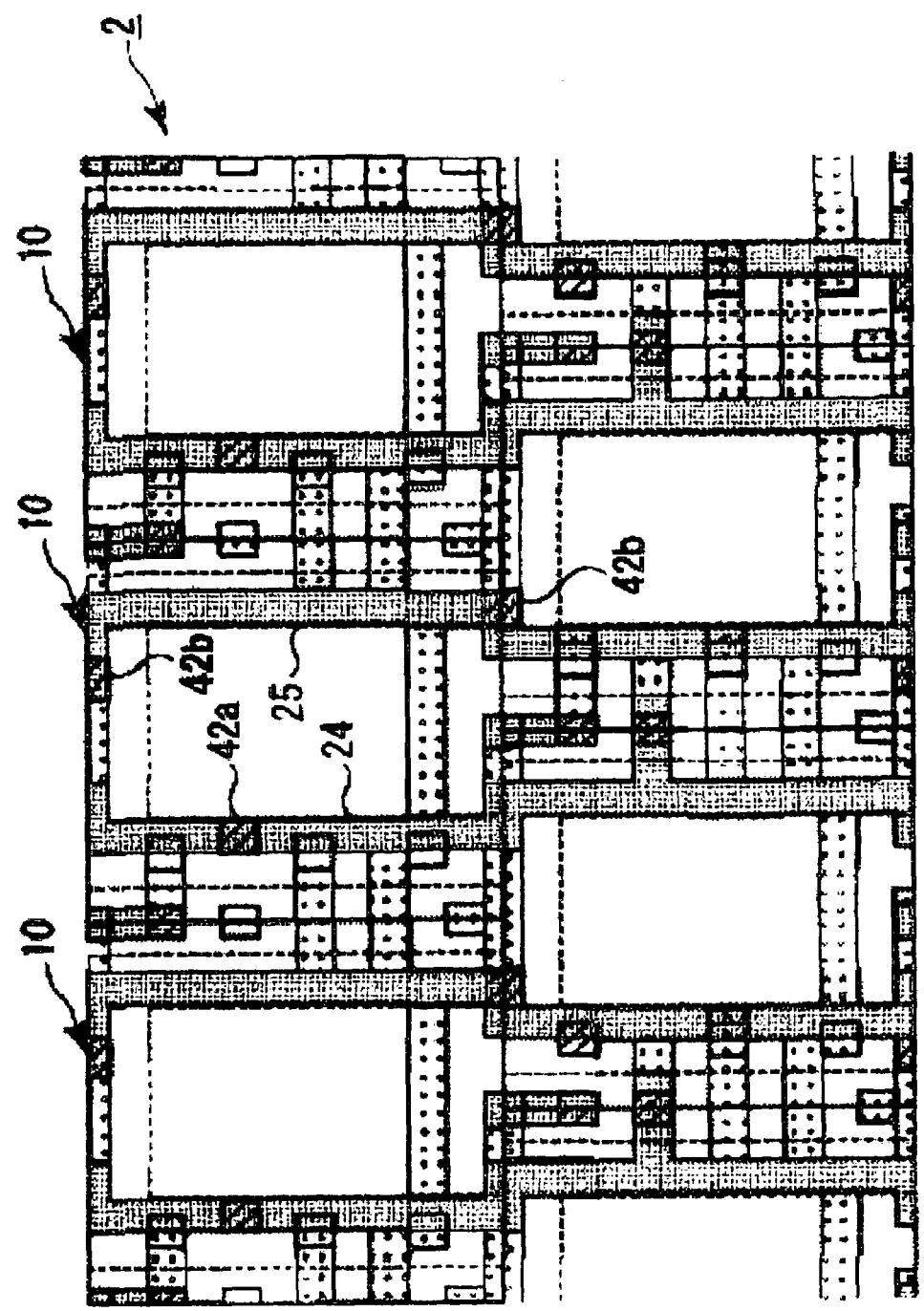
FIG. 22 is a plan view showing a layout of the second metal wiring.
Figure 23:
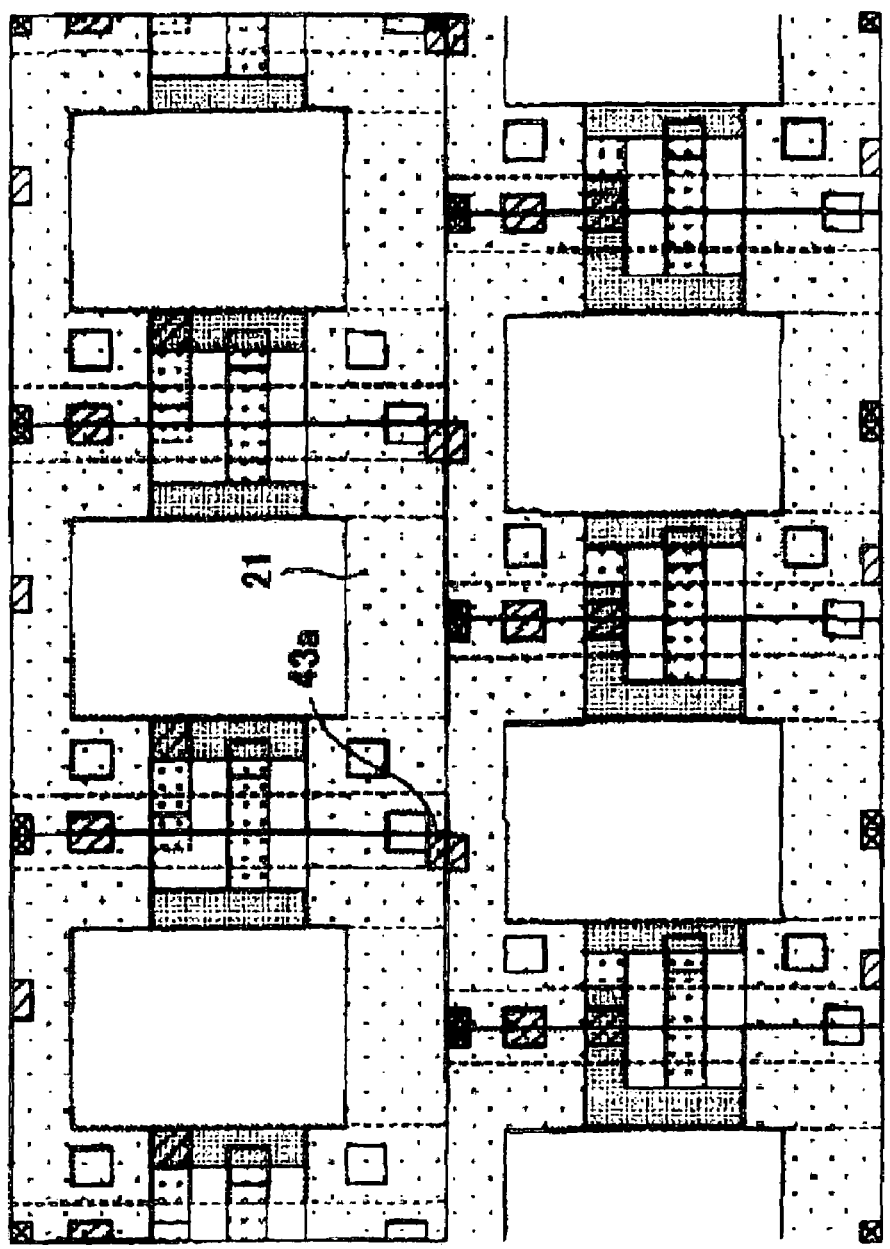
FIG. 23 is a plan view showing a layout of the third metal wiring.

An example of a 3+2 pixel structure that forms the circuit of a 3Tr type CMOS image sensor 1 according to an embodiment of the present invention is shown next. FIG. 20 is a plan view showing a layout of the active region and CMOS transistor array in the pixel. FIG. 21 is a plan view showing a layout of the first metal wiring. FIG. 22 is a plan view showing a layout of the second metal wiring. FIG. 23 is a plan view showing a layout of the third metal wiring.

Here, as shown in FIG. 20, the PD 11 and respective CMOS transistors are arrayed in parallel in a column direction. The pixel 10 is shifted by half the width thereof (a shifted-by-½-pitch type) every row.

Here, on the silicon substrate 3, there is provided at the center of the pixel 10 defined by relevant element isolation films an active region of rectangular PD 11. Also, an active region of FD 16 is provided in the way that it bridges relevant two of the pixels 10 that are adjacent in the row direction.

Further, three CMOS transistors, i.e. the gate electrode of the RST 13, the gate electrode of the SF-Tr 14, and the gate electrode of the SE 15, are vertically disposed in a row in the column direction.

FIG. 21 shows the first metal wiring layer that is connected to each of the respective CMOS transistors. That layer has a metal wiring 51*a* that connects the FD 16 and the gate electrode of the SF-Tr 14 via the contact plug 41*a* and the contact plug 41*b*, a metal wiring 51*b* that is connected to the gate electrode of the RST 13 and the drain region thereof via the contact plug 41*c*, a metal wiring 51*d* that is connected to the drain region of the SF-Tr 14 via the contact plug 41*d*, and the SE/TG line 26 that is connected to the source region of the SE 15 via the contact plug 41*e*. Although, here, the pixel 10 is shifted by half of the width thereof every row, the metal wiring pattern is the same.

FIG. 22 shows the second metal wiring layer that is connected to each of the respective CMOS transistors. That layer has disposed therein the VR power source line 24 that is electrically connected to the drain region of each of the RST 13 and SF-Tr 14 via the contact plug 42*a*, and the signal read-out line 25 that is connected to the source region of the SE 15 via the contact plug 42*b*.

The VR line 24 in the second metal wiring layer, in the upper row, in order to perform wiring while the PD 11 is being bypassed, is provided on the left side of the PD 11, whereas, in the lower row, because the position of the pixel 10 is shifted half of the pixel relative to the relevant pixel 10 in the upper row, the VR line 24 is provided on the right side. Further, every row, when the VR line 24 is located on the right side of the PD 11, the VR line 24 is connected to the PD 11, by means of the leading line for contact, from the VR 24 via the VR contact plug. Accordingly, the metal wiring pattern of the pixel in one row becomes different from that of the relevant pixel in the adjacent row thereto.

FIG. 23 shows the third metal wiring layer, which has the RST line 21 that is electrically connected to the gate electrode of the RST 13 via the contact plug 43*a*, while light-shielding the FD16.

In the 3Tr type structure, a plurality of the CMOS transistors are vertically arrayed in column, thereby they are arrayed in parallel with the PD 11. By doing so, it is possible to make wide the gate electrode of the CMOS transistor, to make less the variation in characteristic of the CMOS transistor, and, as a result, to make good the image of the CMOS image sensor.

Embodiment 5

Figure 24:
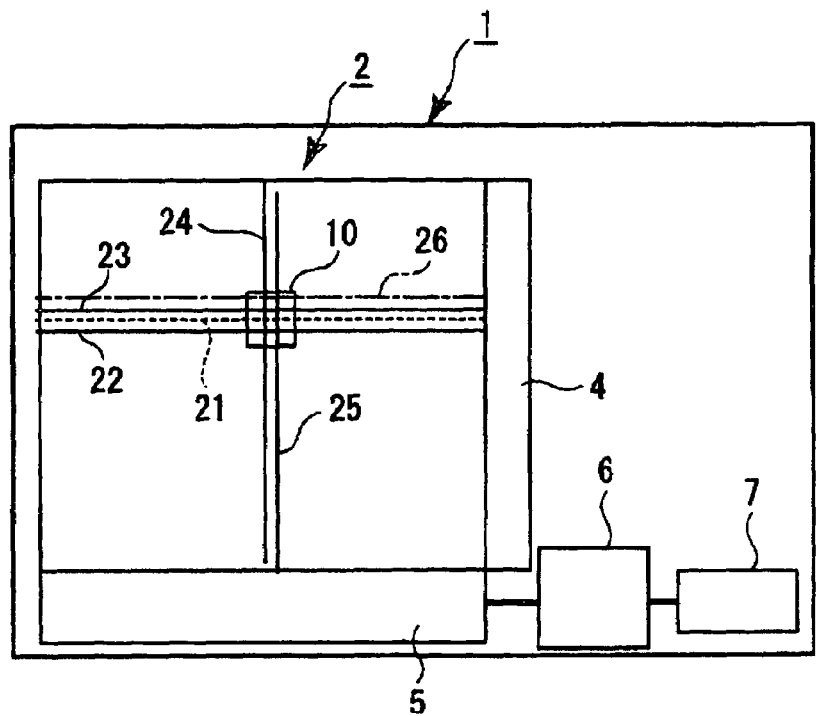
FIG. 24 is a circuit diagram showing a single piece of pixel in the CMOS image sensor according to an embodiment of the present invention.
Figure 25:
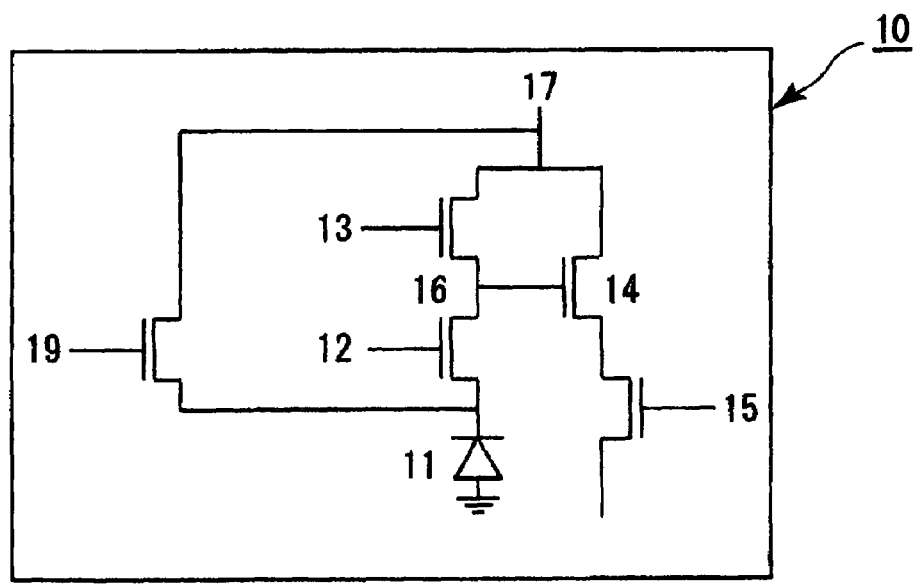
FIG. 25 is a circuit diagram showing the CMOS image sensor according to the embodiment of the present invention.

FIG. 24 is a circuit diagram of a single piece of pixel in the photographing apparatus according to an embodiment of the present invention. FIG. 25 is a circuit diagram of the photographing apparatus according to the embodiment of the present invention.

As shown in FIG. 24, the apparatus is a CMOS image sensor that is equipped with a pixel 10 (hereinafter referred to simply as "the 5Tr type") that is constructed of one piece of PD 11 and five CMOS transistors of the TG 12 that is the first transistor, the RST 13 that is the second transistor, the SF-Tr 14 that is the third transistor, the SE 15 that is the fourth transistor, and, further, one more, an overflow drain (hereinafter referred to as "the OFD") that is another transistor.

As shown in FIG. 24, as the fifth transistor, the OFD 19 connects the cathode terminal of the PD 11 and the VR line 25. This OFD 19, independently from the reading-out of the signal of the CMOS image sensor, enables making stable the electric charge accumulated in the PD 11 to the prescribed value that reflects the reset voltage VR 17. In the 4Tr type, the PD 11 must be made to have the prescribed value that reflects the reset voltage VR 17, via the FD 16. This is because, even when the TG 12 is kept "off", it happens that electric charge occurs in the PD 11 due to intense light and, therefore, using the OFD 19, there is prevented flowing of that electric charge into other circuits within the pixel.

Also, as shown in FIG. 24, compared with FIG. 2 showing the circuit diagram of the 4Tr type CMOS image sensor, an OFD line 27 is provided in the row direction.

Figure 26:
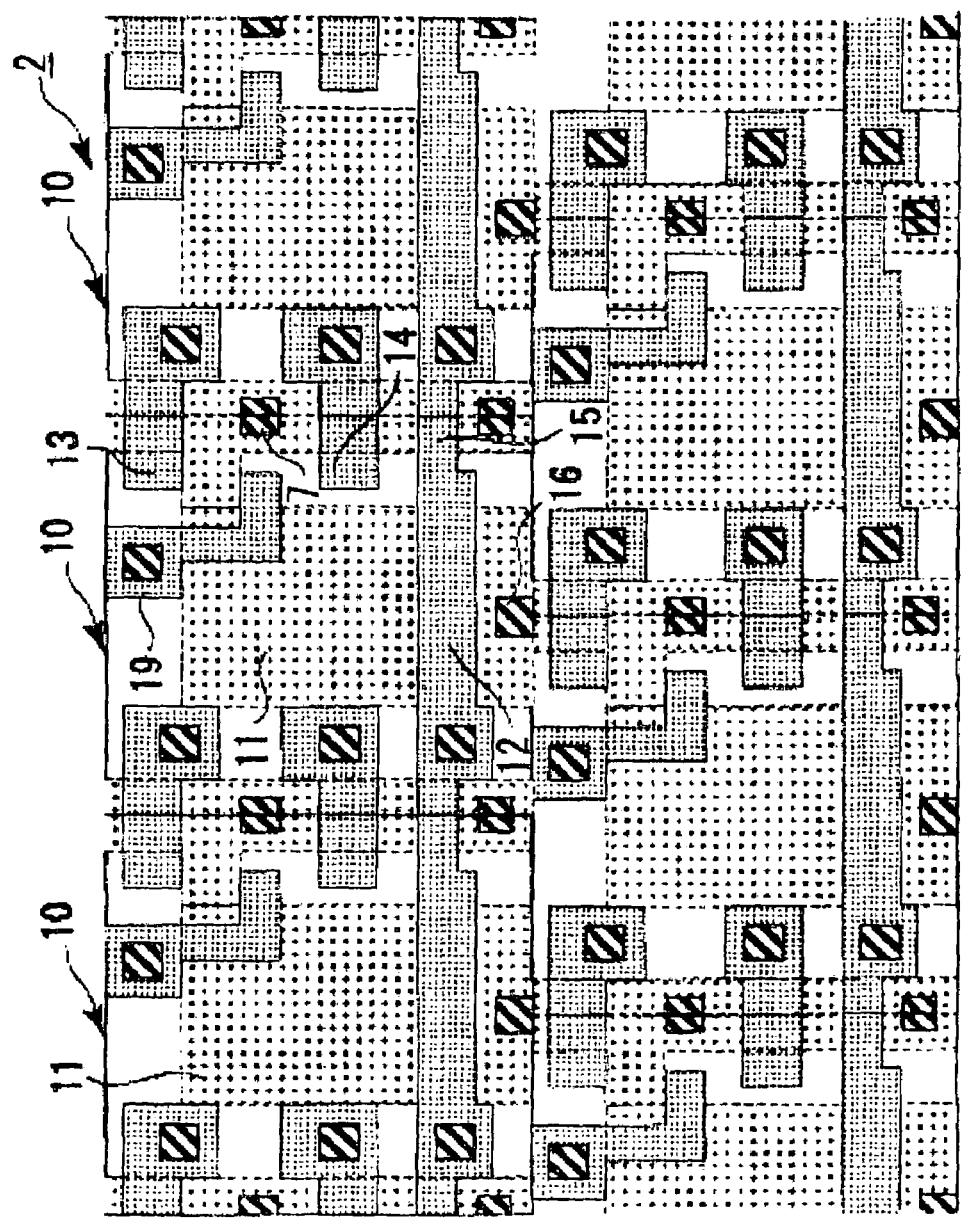
FIG. 26 is a plan view showing a layout of the active region and CMOS transistor array in the pixel.
Figure 27:
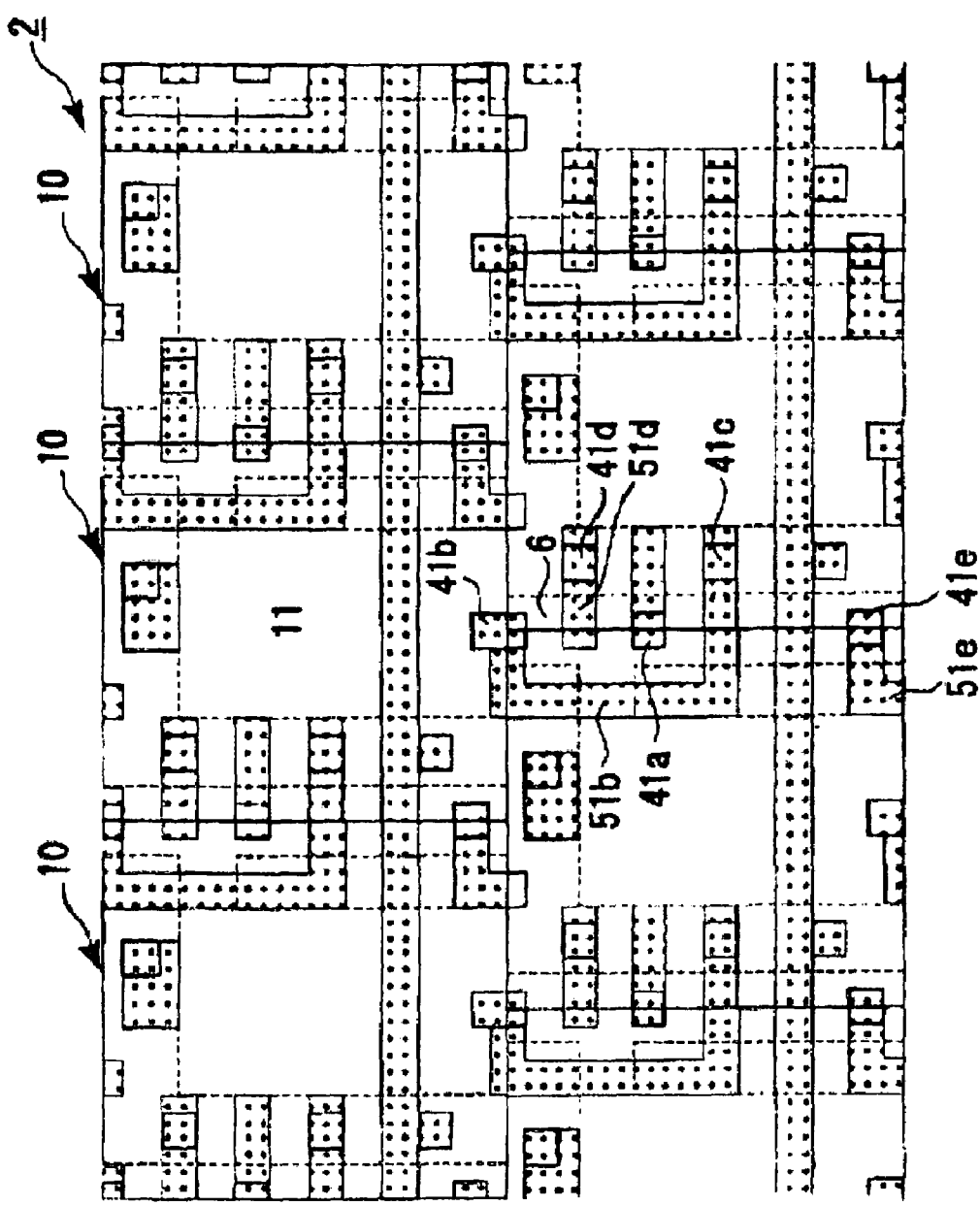
FIG. 27 is a plan view showing a layout of the first metal wiring.
Figure 28:
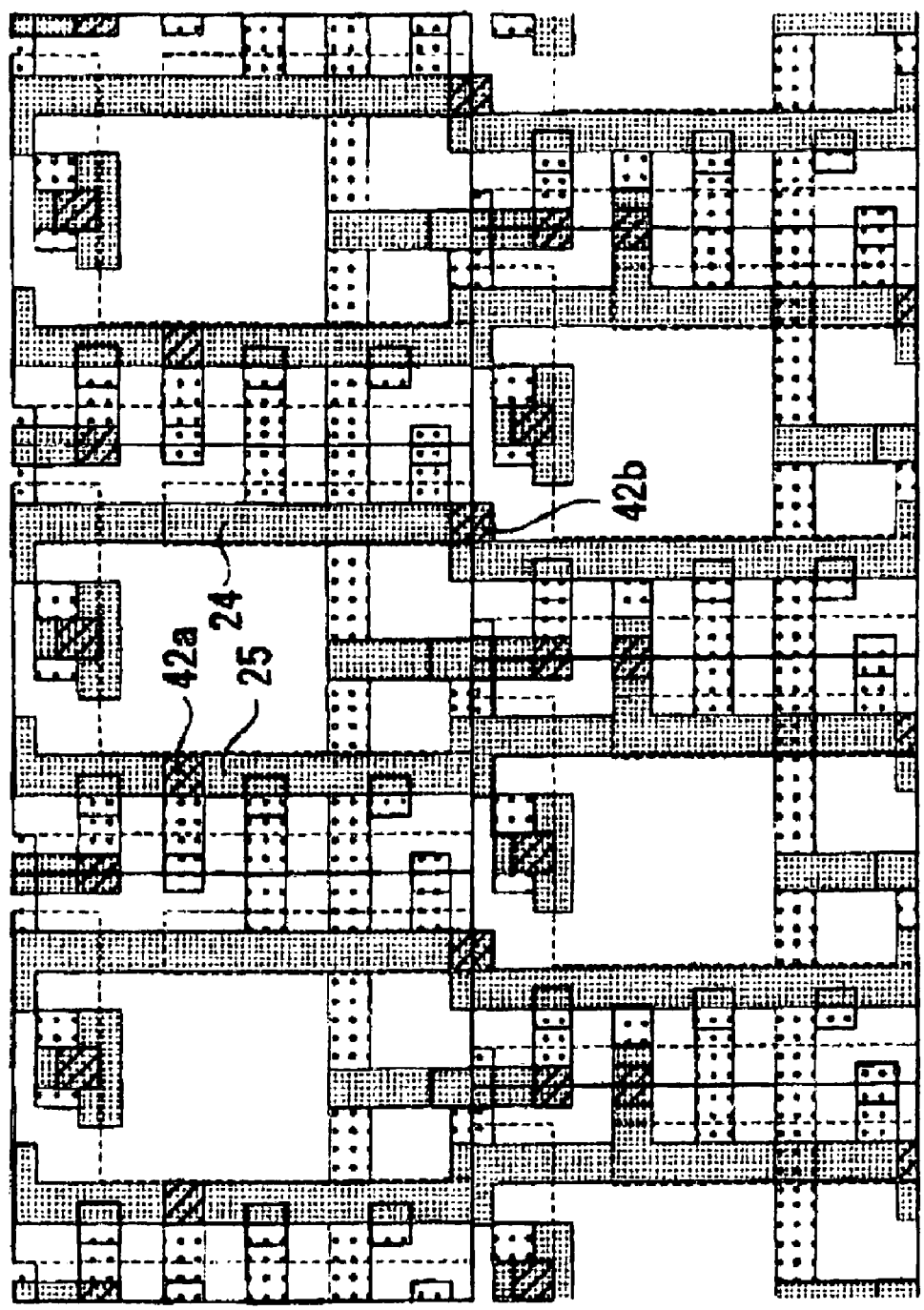
FIG. 28 is a plan view showing a layout of the second metal wiring.
Figure 29:
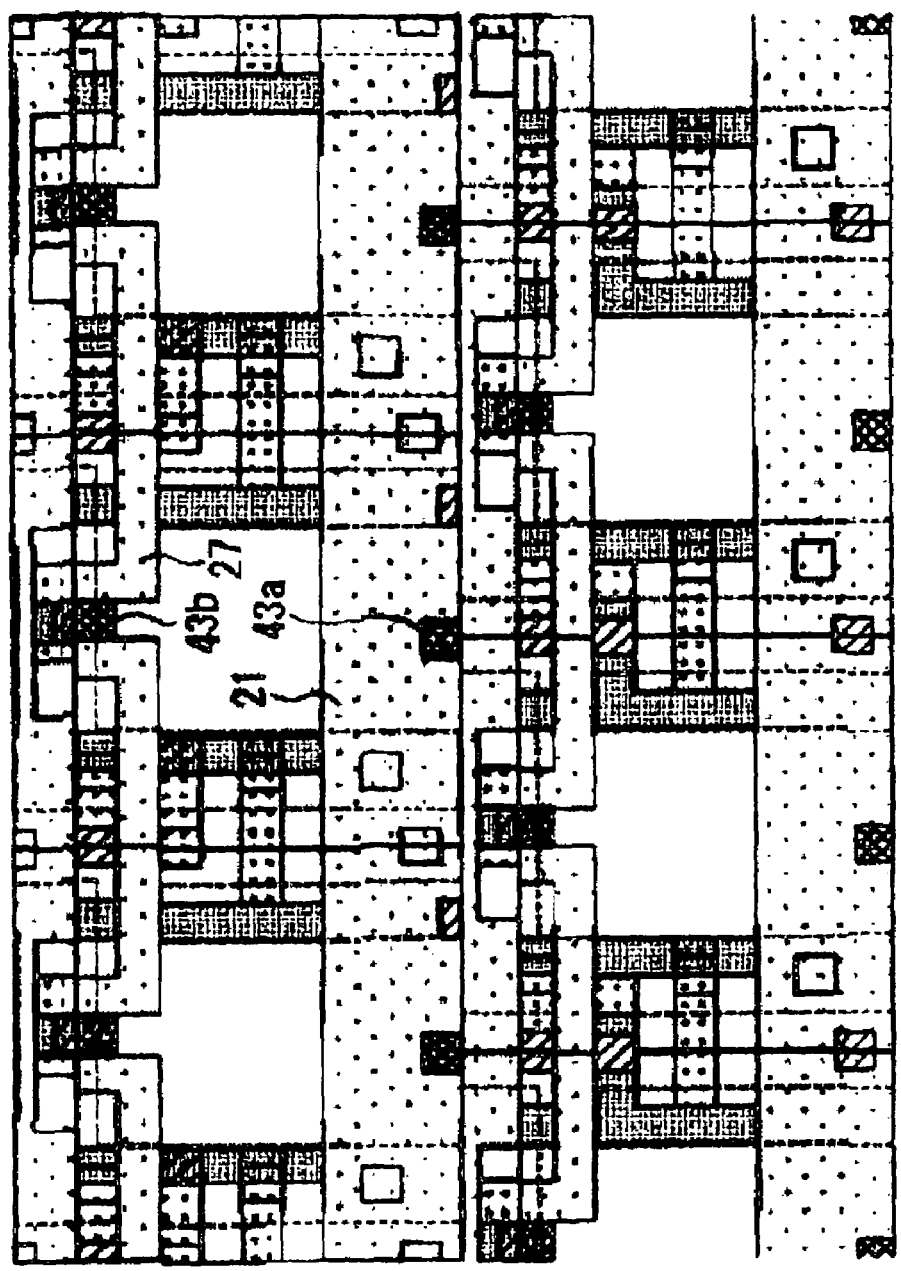
FIG. 29 is a plan view showing a layout of the third metal wiring.
Figure 30:
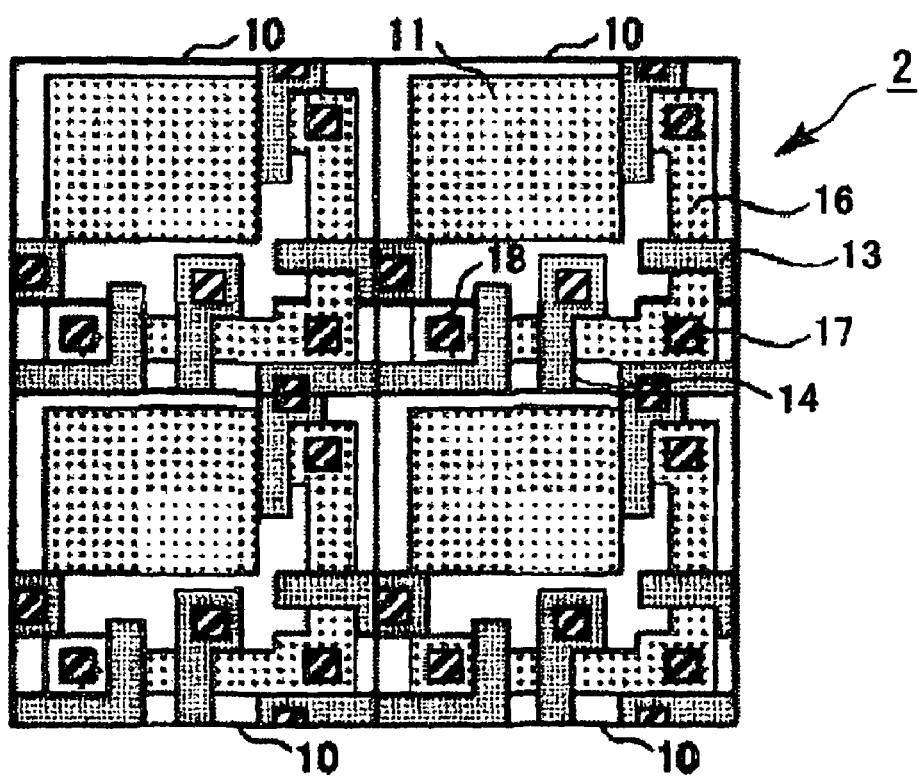
FIG. 30 is a plan view showing a layout of the active region and CMOS transistor array in a conventional pixel.

Next, an example of a 3+2 pixel structure that forms the circuit of a 5Tr type CMOS image sensor 1 according to an embodiment of the present invention is shown. FIG. 26 is a plan view showing a layout of the active region and CMOS transistor array in the pixel. FIG. 27 is a plan view showing a layout of the first metal wiring. FIG. 28 is a plan view showing a layout of the second metal wiring. FIG. 29 is a plan view showing a layout of the third metal wiring.

In the present invention, as shown in FIG. 26, in each pixel 10, the PD 11 and respective CMOS transistors are arrayed in parallel in the column direction. The pixel 10 is made up into a (shifted-by-½-pitch type) structure wherein one pixel 10 in one row is shifted by half of the width thereof, in the row direction, relative to another upper one which is adjacent thereto in the immediately upper row, every row. Further, the TD line and SE line 22 of the metal wiring are made common. By the OFD's 19 being provided on the upside of the PD 11, the PD 11 can easily be made to have the prescribed value by the VR 17.

Also, even when the number of the CMOS transistors increases, the occupied-area percentage of the PD is not greatly decreased. Specifically, the occupied-area percentage of the 5Tr type is a value that is approximate to 29% of the conventional 3Tr type. However, the layout can be made the one that doesn't make small the width of the gate electrode of each CMOS transistor.

FIG. 27 shows the first metal wiring layer that is connected to each CMOS transistor and that has wired therein the SE/TG line 26. The wiring pattern is substantially the same as that in the case of the 4Tr type shown in FIG. 8. Here, the wiring pattern in each pixel is the same.

Also, FIG. 28 shows the second metal wiring layer that is connected to each CMOS transistor and that has wired therein the VR line 24 and signal read-out line 25.

The signal leading line 25 of the second metal wiring layer, in the upper row, in order to make that line a single one, it is provided on the right side of the PD 11 while the PD 11 is being bypassed. On the other hand, in the lower row, because the position of the pixel 10 is shifted by half of the pixel relative to the relevant pixel 10 in the upper row, the signal leading line 25 is provided on the left side of the PD 11. The line 25 is connected to the source region of the SE 15 via the contact plug 42b by a short contact leader.

The VR line 24 in the second metal wiring layer, also, similarly, in the upper row, in order to perform wiring while the PD 11 is being bypassed, is provided on the left side of the PD 11, whereas, in the lower row, because the position of the pixel 10 is shifted by half of the pixel relative to the relevant pixel 10 in the upper row, the VR line 24 is provided on the right side, and is connected to the RST 13. Accordingly, here, a different wiring pattern is formed every row.

Also, FIG. 29 shows the third metal wiring layer that is connected to each CMOS transistor and that has wired therein, while light-shielding the FD 16, the RST line 21 and the OFD line 27 that in order to be connected to the gate electrode of the OFD 16 is extended in the row direction. The wiring pattern in each pixel is the same.

In the 5Tr type structure, compared to the conventional 4Tr type, the CMOS transistors other than the OFD are arrayed in row in the row direction, thereby they are arrayed in parallel with the PD 11. By doing so, it is possible to keep less the decrease of the occupied-area percentage's of the PD11 and to maintain the gate electrode of each CMOS transistor while the width thereof is being kept great, and thereby, to make less the variation in characteristic of the CMOS transistor, and, as a result, to make good the image of the CMOS image sensor.

As has been mentioned above, in the photographing apparatus of the present invention, by the array within the pixel of the photo-diode and CMOS transistors, there is increased the occupied-area percentage within the pixel of the photo-diode. By doing so, it is possible to enhance the sensitivity of the photographing apparatus 1. Also, by making wide the interval or gap between the CMOS transistors, it is possible to make great the width of the gate electrode and suppress the variation in characteristic of the transistor. In addition, it is possible to increase the freedom in which the metal wiring layer is laid out.

What is claimed is:

1. A CMOS image sensor, comprising:
   pixels, each of said pixels comprising
   a photo-electric conversion element, and
   a transfer transistor that transfers a signal of the photo-electric conversion element, a source follower transistor that amplifies said signal, a reset transistor that resets said source follower transistor, and a select transistor that reads out a signal from the source follower transistor,
   wherein said pixels are arrayed in a form of a lattice, and in said respective pixels, said transfer transistor, said source follower transistor, said reset transistor, and said select transistor are laid out in a row in a column direction of said pixels.

2. A CMOS image sensor, comprising:
   pixels, each of said pixels comprising
   a photo-electric conversion element, and
   a source follower transistor that amplifies a signal from said photo-electric conversion element, a reset transistor that resets said source follower transistor, and a select transistor that reads out a signal from said source follower transistor,
   wherein said pixels are arrayed in a form of a lattice, and in said respective pixels, said source follower transistor, said reset transistor and said select transistor are laid out in a row in a column direction of said pixels.

3. A CMOS image sensor, comprising:
   pixels, each of said pixels comprising
   a photo-electric conversion element, and
   a transfer transistor that transfers a signal from said photo-electric conversion element, a source follower transistor that amplifies said signal, a reset transistor that resets said source follower transistor, a select transistor that reads out a signal from said source follower transistor, and an overflow drain transistor that controls the electric charge from said photo-electric conversion element,
wherein said pixels are arrayed in a form of a lattice. and in said respective pixels, said transfer transistor, said source follower transistor, said reset transistor, and said select transistor are laid out in a row in a column.

4. A photographing apparatus according to claim 1, 2 or 3, wherein,
the pixel is disposed in the way that the pixel is shifted half the pixel in the row direction every row.

5. A photographing apparatus according to claim 4, wherein
a row comprising pixels for obtaining information of red and blue and a row comprising pixels for obtaining information of green are alternately disposed.

6. A photographing apparatus according to claim 4, wherein
the left/right arrayed positions of the photo-electric conversion element and these transistors in the pixel are inverted every row.

7. A photographing apparatus according to claim 5, wherein
the left/right arrayed positions of the photo-electric conversion element and these transistors in the pixel are inverted every row.

8. A photographing apparatus according to claim 6, wherein,
in the pixel, the left/right sides of patterns of metal wiring layers in adjacent rows are inverted.

9. A photographing apparatus according to claim 7, wherein in the pixel, the left/right sides of patterns of metal wiring layers in adjacent rows are inverted.

10. A photographing apparatus according to claim 6, wherein in the pixel, patterns of metal wiring layers in adjacent rows are different from each other.

11. A photographing apparatus according to claim 7, wherein in the pixel, patterns of metal wiring layers in adjacent rows are different from each other.

12. A photographing apparatus according to claim 4, wherein
in the pixel, gate electrodes of the transfer transistor and select transistor are connected to each other by the same metal wiring.

13. A photographing apparatus according to claim 5, wherein
in the pixel, gate electrodes of the transfer transistor and select transistor are connected to each other by the same metal wiring.

* * * * *